(12) United States Patent
Sugiyama

(10) Patent No.: US 6,723,614 B2
(45) Date of Patent: Apr. 20, 2004

(54) SEMICONDUCTOR DEVICE COMPRISING LAYERED POSITIONAL DETECTION MARKS AND MANUFACTURING METHOD THEREOF

(75) Inventor: Masao Sugiyama, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/003,307

(22) Filed: Dec. 6, 2001

(65) Prior Publication Data
US 2002/0036357 A1 Mar. 28, 2002

Related U.S. Application Data

(62) Division of application No. 09/197,765, filed on Nov. 23, 1998.

(30) Foreign Application Priority Data
Jun. 22, 1998 (JP) .......................................... 10-175003

(51) Int. Cl.[7] .......................... H01L 21/76; H01L 21/78
(52) U.S. Cl. ......................... 438/401; 438/462; 438/975
(58) Field of Search ................................. 438/401, 462, 438/975

(56) References Cited

U.S. PATENT DOCUMENTS 5,270,255 A    12/1993  Wong
5,939,226 A     8/1999  Tomimatu
5,949,145 A  *  9/1999  Komuro ..................... 257/797
6,080,635 A  *  6/2000  Jang et al. .................. 438/401
6,165,656 A    12/2000  Tomimatu

FOREIGN PATENT DOCUMENTS

JP    40-2210819   *  8/1990   ........... H01L/21/20
JP    02-229419       9/1990
JP    03-177013       8/1991

* cited by examiner

Primary Examiner—Amir Zarabian
Assistant Examiner—Pamela E Perkins
(74) Attorney, Agent, or Firm—McDermott, Will & Emery

(57) ABSTRACT

A semiconductor device that permits effective use of a region positioned under a positional detection mark or an external electrode, i.e., the region that has not been conventionally utilized may be provided. In a semiconductor device including a lower layer, a shielding film and an upper layer, the lower layer includes at least one selected from the group consisting of a positional detection mark, a quality testing element, and a circuit element. The shielding film is formed on the lower layer and shields an energy beam used for detecting a positional detection mark. The upper layer includes a positional detection mark formed on the shielding film.

2 Claims, 22 Drawing Sheets

US 6,723,614 B2

SEMICONDUCTOR DEVICE COMPRISING LAYERED POSITIONAL DETECTION MARKS AND MANUFACTURING METHOD THEREOF

This application is a divisional of application Ser. No. 09/197,765 filed Nov. 23, 1998.

BACKGROUND OF THE INVENTION

1. Field of the Invention

The present invention relates generally to semiconductor devices and manufacturing methods thereof, and more particularly, to a semiconductor device which permits the area occupied by positional detection marks or the like to be reduced and a manufacturing method thereof.

2. Description of the Background Art

In conventional manufacturing processes of semiconductor devices, positional detection marks are used in order to improve the positional precision of circuit patterns transferred by means of photolithography. FIG. 25 is a cross sectional view of a semiconductor device having conventional positional detection marks. Referring to FIG. 25, such a conventional semiconductor device will be described.

Referring to FIG. 25, the conventional semiconductor device includes a semiconductor substrate 101, first to third interlayer insulating films 102, 108 and 110, and a positional detection mark 112. First interlayer insulating film 102 is formed on a main surface of semiconductor substrate 101. Second interlayer insulating film 108 is formed on first interlayer insulating film 102. Third interlayer insulating film 110 is formed on second interlayer insulating film 108. Grooves 111a to 111h serving as positional detection mark 112 are formed on the surface of third interlayer insulating film 110. Positional detection mark 112 is used as an alignment mark in the process of photolithography to an aluminum film or the like formed on third interlayer insulating film 110. Note that, in a region not shown in FIG. 25, elements such as transistors and interconnections are formed depending upon the function of the semiconductor device.

Herein, grooves 111a to 111h serving as positional detection mark 112 are simultaneously formed in the process of forming in the process of forming through holes in third interlayer insulating film 110. More specifically, in the process of photolithography for through holes formed in third interlayer insulating film 110, a resist pattern is formed on the region to form positional detection mark 112 in third interlayer insulating film 110. In the process of anisotropic etching to form the through holes in third interlayer insulating film 110, a part of third interlayer insulating film 110 is used, using the resist pattern as a mask, and grooves 111a to 111h result.

As shown in FIG. 25, conventionally, in the region positioned under positional detection mark 112, positional detection marks or interconnections are not formed in the process of forming elements on the first or second interlayer insulating film. This is for the purpose of preventing errors in positional detection. More specifically, normally, light is directed to positional detection mark 112 and light reflected therefrom is used for detection of the mark. If structures such as interconnections are present in the underlying layer of positional detection mark 112, the light for detecting positional detection mark 112 could reach such structures through first to third interlayer insulating films 102, 108 and 111. Then, these structures cause the light for detecting positional detection mark 112 to scatter, which impedes the accurate detection of positional detection mark 112. In order to prevent this problem, structures such as interconnections or positional detection marks are not conventionally formed in the underlying layer of positional detection mark 112.

Meanwhile, as semiconductor devices have become more highly integrated and complicated, layered structures are employed for the devices. Thus, a positional detection mark is necessary for each layer. As shown in FIG. 25, however, only one positional detection mark may be formed at one position, and therefore the area occupied by positional detection marks increase as the number of layers increases.

One method of manufacturing a semiconductor device to solve this disadvantage is disclosed by Japanese Patent Laying-Open No. 2-229419, wherein positional detection marks in different layers are formed at the same position so as to overlap two-dimensionally. In the disclosed semiconductor device, however, errors or the like in the manufacturing process during forming positional detection marks cause positional detection marks to be erroneously recognized as is the case with the above conventional case, if the positions of positional detection marks in the upper and lower layers are even slightly shifted from each other.

Another method of manufacturing a semiconductor device, proposed in order to solve the above-described disadvantage is disclosed by Japanese Patent Laying-Open No. 3-177013, wherein a light beam for detecting a positional detection mark is obliquely irradiated and only the positional detection mark in a layer of interest is detected. By this method, however, other positional detection marks formed in the underlying layers of a positional detection mark to be detected are also recognized through the interlayer insulating film as is the case with the above conventional method, and it was difficult to completely prevent the erroneous detection of positional detection marks in the underlying layers.

In the conventionally proposed semiconductor devices including positional detection marks, the influence of other positional detection marks formed in the underlying layer of a positional detection mark of interest cannot be eliminated, and it was difficult to form positional detection marks in a layered manner while preventing erroneous recognition of such positional detection marks.

Referring to FIG. 26, a conventional semiconductor device includes a semiconductor substrate 101, an interlayer insulating film 102, a bonding pad 134a, and a glass coat 135. Interlayer insulating film 102 is formed on semiconductor substrate 101. Bonding pad 134a is formed on interlayer insulating film 102. Glass coat 135 is formed on interlayer insulating film 102 and bonding pad 134a, and has an opening in the region positioned on bonding pad 134a.

As shown in FIG. 26, in the region positioned under bonding pad 134a serving as an external electrode for the semiconductor device, conventionally, no such structure as interconnections is formed. This is because the insulation property of interlayer insulating film 102 could deteriorate by damages such as cracks made in interlayer insulating film 102 under bonding pad 134a, at the time of thermocompression bonding of an interconnection of gold or the like to bonding pad 134a. If the insulation property of interlayer insulating film 102 thus deteriorates, and an interconnection is formed under bonding pad 134a, the interconnection and bonding pad 134a could be short-circuited, which causes the erroneous operations of the semiconductor device.

Thus, conventionally, in the region positioned under positional detection mark 112 (see FIG. 25) or under bonding pad 134a (see FIG. 26), no structure such as interconnections is formed, in other words, the region is a so-called dead (unused) space. However, today, as semiconductor devices are to be more miniaturized and highly integrated, there arises a need to efficiently use such unused spaces.

SUMMARY OF THE INVENTION

It is one object of the invention to provide a semiconductor device which permits effective use of a region positioned under positional detection marks or external electrodes, in other words, the region which has not been conventionally used.

Another object of the invention is to provide a method of manufacturing a semiconductor device which permits effective use of a region positioned under positional detection marks and external electrodes, in other words, the region which has not been conventionally used.

A semiconductor device according to one aspect of the present invention includes a lower layer, a shielding film, and an upper layer. The lower layer includes at least one selected from the group consisting of a positional detection mark, a quality testing element, and a circuit element. The shielding film is formed on the lower layer and shields an energy beam used for detecting a positional detection mark. The upper layer is formed on the shielding film and includes a positional detection mark.

Herein, the quality testing element refers to an element used for operations to control the manufacturing steps and the quality of the semiconductor device, operations including confirmation of the conduction of interconnections or confirmation of the thickness of films formed in the device. The circuit element refers to an element necessary for the operation of the semiconductor device such as electrodes and interconnections in the device. The energy beam refers to light or an electron beam that can be used for detecting a positional detection mark.

Therefore, in the semiconductor device according to the above aspect of the invention, the presence of the shielding film prevents the energy beam from reaching the lower layer at the time of irradiating an energy beam upon a positional detection mark in the upper layer for the purpose of detecting the mark. This prevents errors in detecting the position of a positional detection mark in the upper layer, errors caused by the scattering of the energy beam by the presence of a positional detection mark in the lower layer. As a result, in the region positioned under the positional detection mark in the upper layer, a lower layer may be formed through the shielding film. Thus, the area occupied by positional detection marks or the like in the surface of the semiconductor device may be reduced. Consequently, a larger number of semiconductor devices may be obtained from a semiconductor wafer in the same size as the conventional case.

In the device according to the above aspect of the invention, the shielding film may have a substantially flat upper surface.

Thus, irregularities to scatter the energy beam used for detecting positional detection marks are not present on the upper surface of the shielding film. As a result, errors in detecting positional detection marks in the upper layer caused by the scattering of the energy beam according to irregularities on the upper surface of the shielding film may be more effectively prevented.

In the semiconductor device according to the above aspect of the invention, the shielding film may be a metal film.

In the semiconductor device according to the above aspect of the invention, the metal film may be an aluminum film.

Thus, the shielding film may be formed as well at the time of forming an aluminum interconnection. As a result, the shielding film may be formed without increasing the number of manufacturing steps as compared to the conventional case.

In the semiconductor device according to the above aspect of the invention, the lower layer may include an insulating film, and the positional detection mark may be a groove formed in the insulating film.

In the semiconductor device according to the above aspect of the present invention, the lower layer may include a lower metal film, and the positional detection mark may be a groove formed in the lower metal film.

In the semiconductor device according to the above aspect of the present invention, the upper layer may include an upper insulating film, and the positional detection mark may be a groove formed in the upper insulating film.

In the semiconductor device according to the above aspect of the present invention, the upper layer may include an upper metal film, and the positional detection mark may be a groove formed in the upper metal film.

In the semiconductor device according to the above aspect of the present invention, the positional detection mark may be formed from a polysilicon film.

A semiconductor device according to another aspect of the invention includes a lower layer, an isolation insulating film, and an upper layer. The lower layer includes at least one of a positional detection mark and a quality testing element. The isolation insulating film is formed on the lower layer. The upper layer is formed on the isolation insulating film and includes at least one selected from the group consisting of the quality testing element, an external electrode, and a dummy layer.

Herein, the external electrode refers to an electrode for connecting a bonding wire for use in transmission of an electrical signal between the semiconductor device and the outside. The dummy layer refers to a structure not directly related to the essential operations of the semiconductor device. The dummy layer includes, for example, a dummy pattern for improving the flatness of the device in the planarization step in the manufacture of the semiconductor device.

Therefore, in the semiconductor device according to the above aspect of the invention, the upper layer and the lower layer are formed upon each other through the isolation insulating film, the region positioned under the quality testing element or external electrode, in other words, the region which has not been effectively used conventionally, can be effectively used for forming positional detection marks. As a result, the area occupied by the quality detecting element or the like may be reduced.

In the semiconductor device according to the aspect of the invention, the lower layer may include an insulating film, and the positional detection mark may be a groove formed in the insulating film.

In the semiconductor device according to the aspect of the invention, the lower layer may include a metal film, and the positional detection mark may be a groove formed in the metal film.

In a method of manufacturing a semiconductor device according to another aspect of the invention, the lower layer including at least one selected from the group consisting of a positional detection mark, a quality testing element, and a circuit element is formed. A shielding film for shielding an energy beam used for detecting a positional detection mark is formed on the lower layer. The upper layer including a positional detection mark is formed on the shielding film.

As a result, a semiconductor device having a lower layer including a positional detection mark or the like through a shielding film under an upper layer including a positional detection mark may be readily obtained.

In the method of manufacturing a semiconductor device according to the above aspect of the invention, an interlayer insulating film may be formed between the lower layer and the shielding film, and the upper surface of the interlayer insulating film may be planarized (flattened).

Consequently, irregularities according to the lower layer structure can be prevented from forming on the surface of the shielding film.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be now described in conjunction with the accompanying drawings.

First Embodiment

Figure 1:
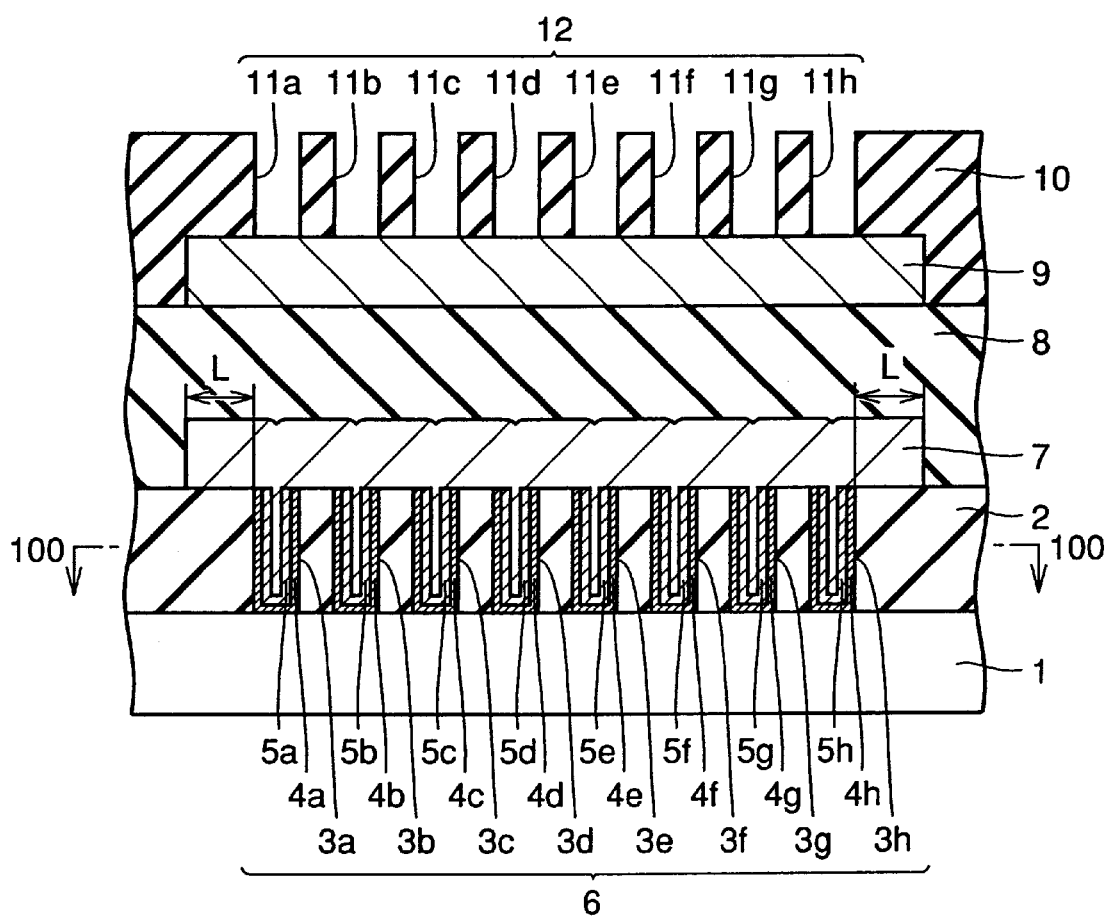
FIG. 1 is a schematic cross sectional view of a semiconductor device according to a first embodiment of the invention.

Referring to FIG. 1, a semiconductor device according to a first embodiment of the invention includes a lower layer positional detection mark 6, first and second aluminum films 7 and 9, and an upper layer positional detection mark 12. An interlayer insulating film 2 is formed on semiconductor substrate 1. Interlayer insulating film 2 is as thick as about 1 $\mu$m. In a prescribed region of interlayer insulating film 2, grooves 3a to 3h are formed. In grooves 3a to 3h, barrier metal layers 4a to 4h of titanium are formed. Tungsten films 5a to 5h are formed on barrier metal layers 4a to 4h. These grooves 3a to 3h, barrier metal layers 4a to 4h and tungsten films 5a to 5h form lower layer positional detection mark 6. Herein, the thickness of barrier metal layers 4a to 4h is about 800 Å, and the thickness of tungsten films 5a to 5h is about 4000 Å.

Figure 2:
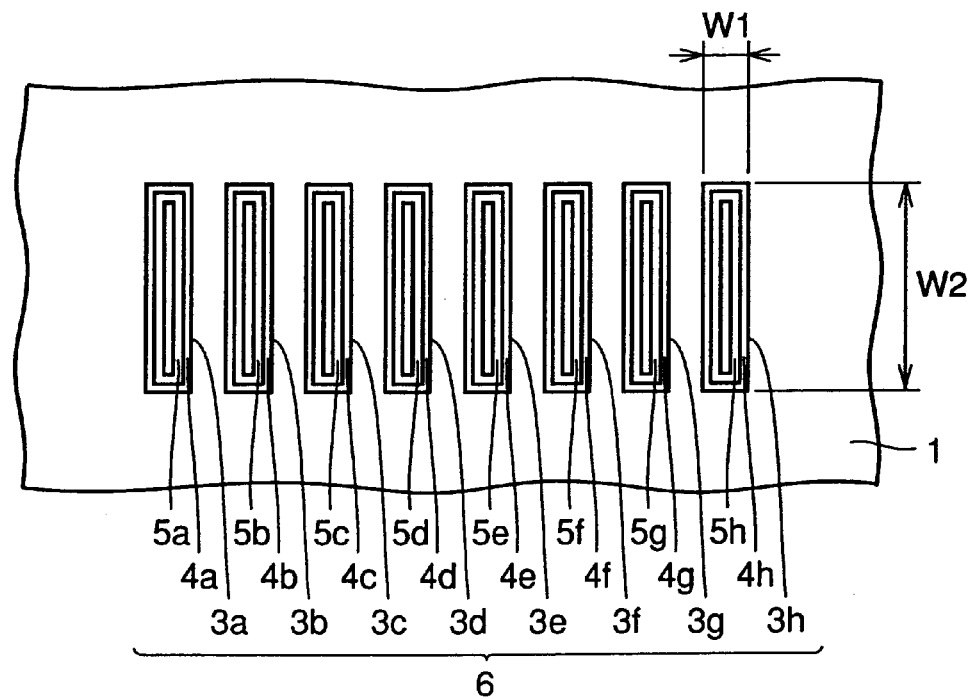
FIG. 2 is a schematic cross sectional view along line 100—100 in FIG. 1.

The cross sectional view of lower layer positional detection mark 6 is given in FIG. 2. Referring to FIG. 2, grooves 3a to 3h forming lower layer positional detection mark 6 are each in a rectangular shape where a shorter side has a length W1 of about 6 $\mu$m, and a longer side has a length W2 of about 70 $\mu$m.

Figure 3:
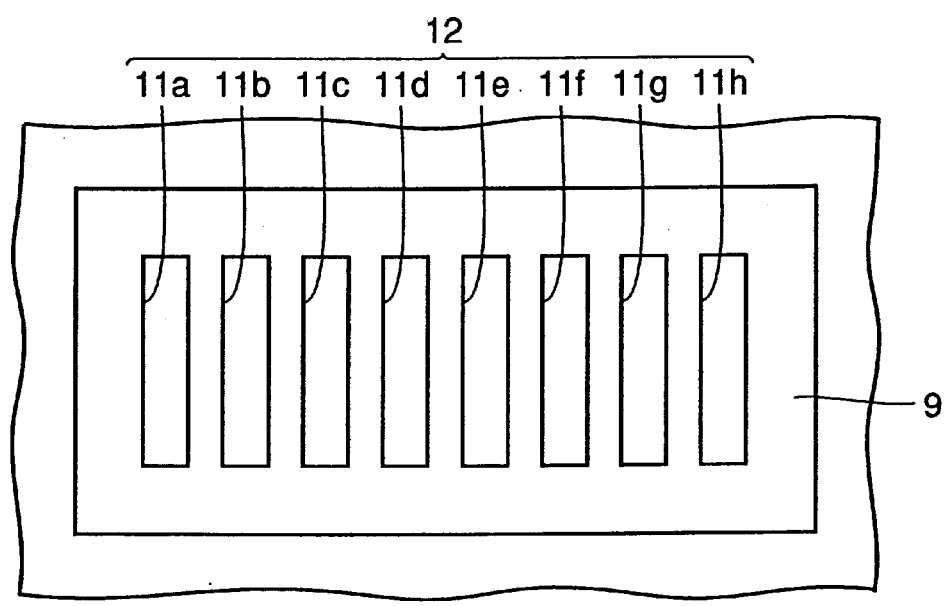
FIG. 3 is a schematic plan view of the semiconductor device shown in FIG. 1.

Referring to FIG. 1, in the region positioned on interlayer insulating film 2 and on lower layer positional detection mark 6, a first aluminum film 7 having a thickness of about 0.4 $\mu$m is formed. First aluminum film 7 extends outside the outermost circumference of positional detection mark 6 by a length L (normally several $\mu$m or more) to cover positional detection mark 6. An interlayer insulating film 8 is formed on first aluminum film 7 and interlayer insulating film 2. Interlayer insulating film 8 is also about as thick as 1 $\mu$m. A second aluminum film 9 is formed on interlayer insulating film 8 and in the region positioned on first aluminum film 7. The thickness of second aluminum film 9 is about 0.4 $\mu$m. An interlayer insulating film 10 is formed on interlayer insulating film 8 and second aluminum film 9. Grooves 11a to 11h to form upper layer positional detection mark 12 are formed in interlayer insulating film 10 in the region positioned on second aluminum film 9. A schematic plan view of upper layer positional detection mark 12 and second aluminum film 9 is given in FIG. 3. Referring to FIG. 3, upper layer positional detection mark 12 in the plan view is basically the same as that of lower layer positional detection mark 6 in FIG. 2.

Therefore, in the first embodiment, if an energy beam such as light and an electron beam is irradiated upon upper layer positional detection mark 12 in order to detect the mark, the energy beam may be prevented from reaching lower layer positional detection mark 6, because aluminum film 9 serving as a shielding film is present. Thus, errors in detecting the position of upper layer position detection mark 12 because of the scattering of the energy beam reaching lower layer positional detection mark 6 may be prevented. As a result, lower layer positional detection mark 6 may be formed under upper layer positional detection mark 12 in a layered manner, and the area occupied by positional detection marks 6 and 12 in the surface of the semiconductor device can be reduced. As a result, a larger number of semiconductor devices may be formed in a semiconductor wafer in the same size as the conventional case.

In addition, since the upper surface of second aluminum film 9 is substantially flat, the scattering of the energy beam can be prevented when the energy beam for detecting upper layer positional detection mark 12 reaches the upper surface of second aluminum film 9. Consequently, errors in detecting the position of upper layer positional detection mark 12 caused by the scattering of the energy beam may be more effectively prevented.

Figure 4:
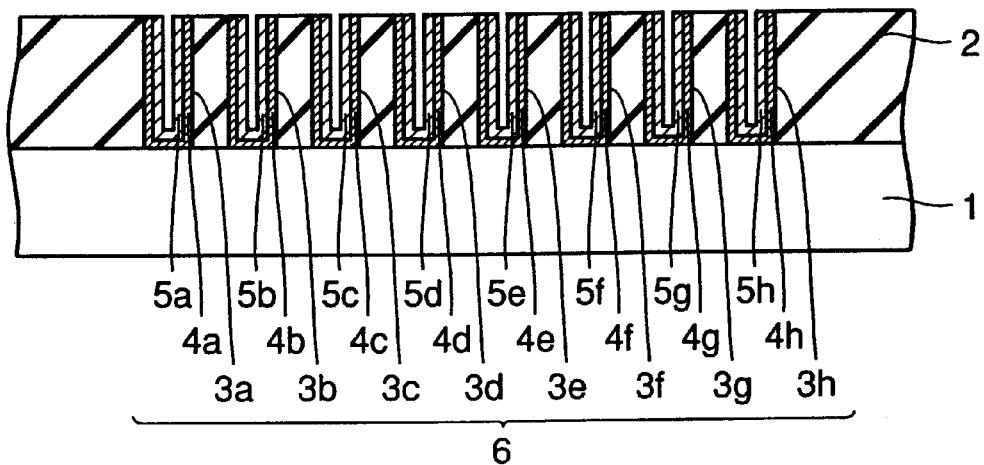
FIGS. 4 to 6 are schematic cross sectional views showing the first to third steps, respectively in the manufacture of the semiconductor device according to the first embodiment of the invention shown in FIG. 1.
Figure 5:
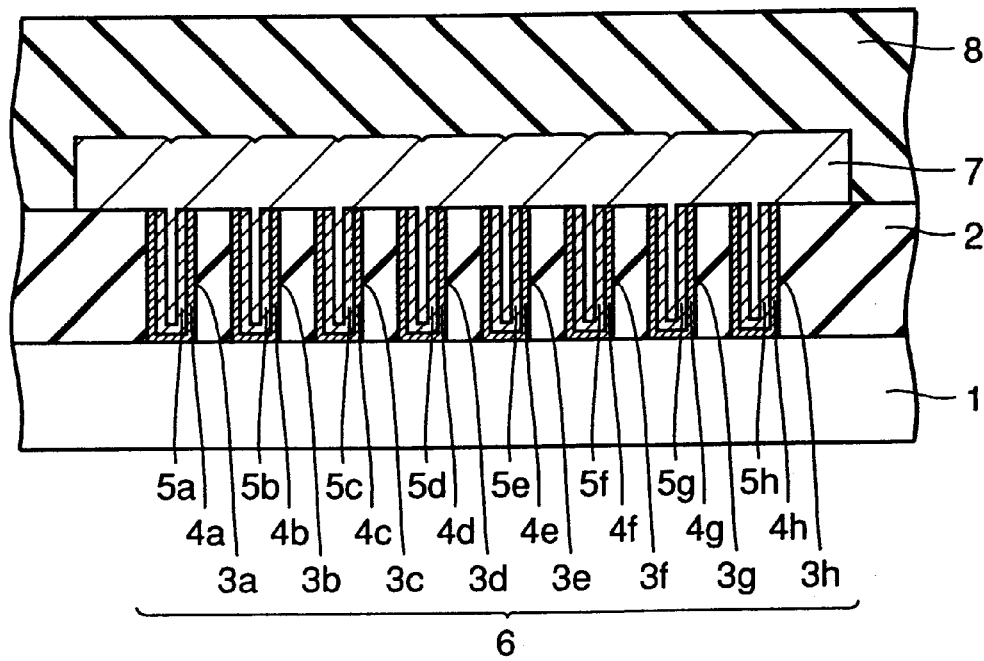
Figure 6:
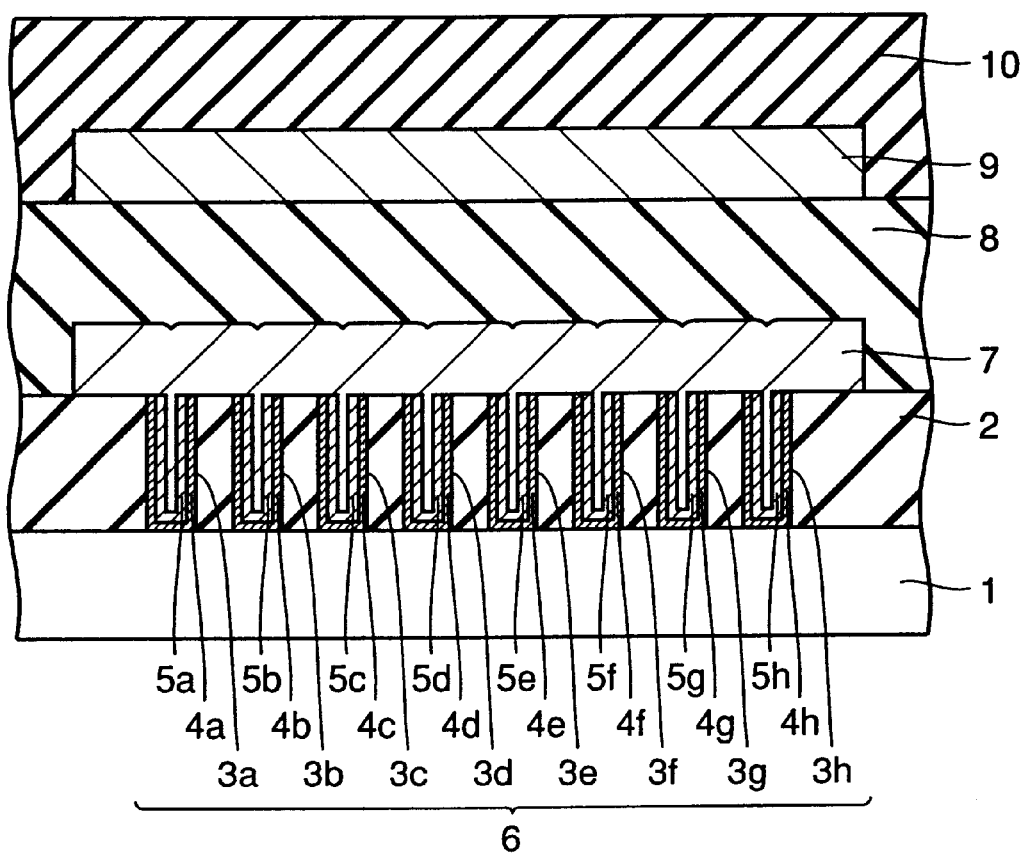

Referring to FIGS. 4 to 6, a method of manufacturing the semiconductor device according to the first embodiment of the invention will be now described.

Interlayer insulating film 2 (see FIG. 4) is formed on semiconductor substrate 1 (see FIG. 4) by means of atmospheric pressure CVD (Chemical Vapor Deposition). At this time, the thickness of deposited interlayer insulating film 2 is about 1.5 $\mu$m. The upper surface of interlayer insulating film 2 is polished for about 0.5 $\mu$m for planarization by means of CMP (Chemical Mechanical Polishing) and the thickness of interlayer insulating film 2 becomes about 1.0 $\mu$m. A resist pattern (not shown) is formed on interlayer insulating film 2. Using the resist pattern as a mask, a part of interlayer insulating film 2 is etched away to form grooves 3a to 3h to be lower layer positional detection mark 6 (see FIG. 4), followed by removal of the resist pattern. Titanium is deposited on interlayer insulating film 2 and in grooves 3a to 3h by means of sputtering, to form barrier metal layers 4a to 4h (see FIG. 4). Tungsten films 5a to 5h are deposited on barrier metal layers 4a to 4h by means of CVD. Thereafter, the barrier metal layers and tungsten films positioned on interlayer insulating film 2 are etched away to obtain a structure as shown in FIG. 4.

Then, an aluminum film having a thickness of about 0.4 $\mu$m is formed on interlayer insulating film 2 and tungsten films 5a to 5h. A resist pattern (not shown) is formed on the aluminum film. Using the resist pattern as a mask, a part of the aluminum film is etched away to form first aluminum film 7, followed by removal of the resist pattern. Note that lower layer positional detection mark 6 is used as a positional detection mark in the photolithography process at the time forming aluminum film 7. This is because the thickness of barrier metal layers 4a to 4g, tungsten films 5a to 5h and the aluminum film is sufficiently small relative to the width of grooves 3a to 3h forming lower layer positional detection mark 6, and positional detection mark 6 is distinguishable after forming the aluminum film.

Subsequently, a TEOS (Tetra Ethyl Ortho Silicate) oxide film is formed to have a thickness of about 2 $\mu$m on first aluminum film 7 and interlayer insulating film 2. The upper surface of the TEOS oxide film is polished for about 1 $\mu$m by means of CMP for planarizing, and second interlayer insulating film 8 (see FIG. 5) is formed as a result. Thus, the structure as shown in FIG. 5 results. Note that there is no pattern formed in the region of second interlayer insulating film 8 positioned on first aluminum film 7.

An aluminum film (not shown) having a thickness of about 0.4 $\mu$m is deposited on second interlayer insulating film 8 by means of sputtering. A resist pattern (not shown) is formed on the aluminum film. Using the resist pattern as a mask, a part of the aluminum film is etched away to form a second aluminum film 9 (see FIG. 6) in the region positioned on first aluminum film 7. Note that the aluminum film is used for interconnections in another region.

Herein, since the upper surface of second interlayer insulating film 8 has been planarized by means of CMP, possible irregularities in the upper surface of first aluminum film 7 will not generate irregularities in the upper surface of second aluminum film 9, while aluminum film 9 does not transmit light for detecting a positional detection mark, and therefore lower layer positional detection mark 6 cannot be detected.

Then, a TEOS oxide film is formed to have a thickness of about 2 $\mu$m on second interlayer insulating film 8 and second aluminum film 9. The upper surface of the TEOS oxide film is polished for about 1 $\mu$m by means of CMP for planarization, and a third interlayer insulating film 10 is formed as a result. Thus, the structure shown in FIG. 6 results.

Subsequently, a resist pattern (not shown) for forming an upper layer positional detection mark 12 (see FIG. 1) is formed on third interlayer insulating film 10, and using the resist pattern as a mask, a part of third interlayer insulating film 10 is etched away to form grooves 11a to 11h (see FIG. 1) to be upper layer positional detection mark 12, followed by removal of the resist pattern, so that the structure as shown in FIG. 1 may be readily obtained.

Upper layer positional detection mark 12 may be used as a positional detection mark in the process of photolithography for forming interconnections of aluminum on third interlayer insulating film 10. Thus, positional detection marks 12 and 6 in the upper and lower layers may be formed in two-dimensionally overlapping regions in a layered manner, the area occupied by these positional detection marks 12 and 6 may be reduced than the conventional cases.

Second Embodiment

Figure 7:
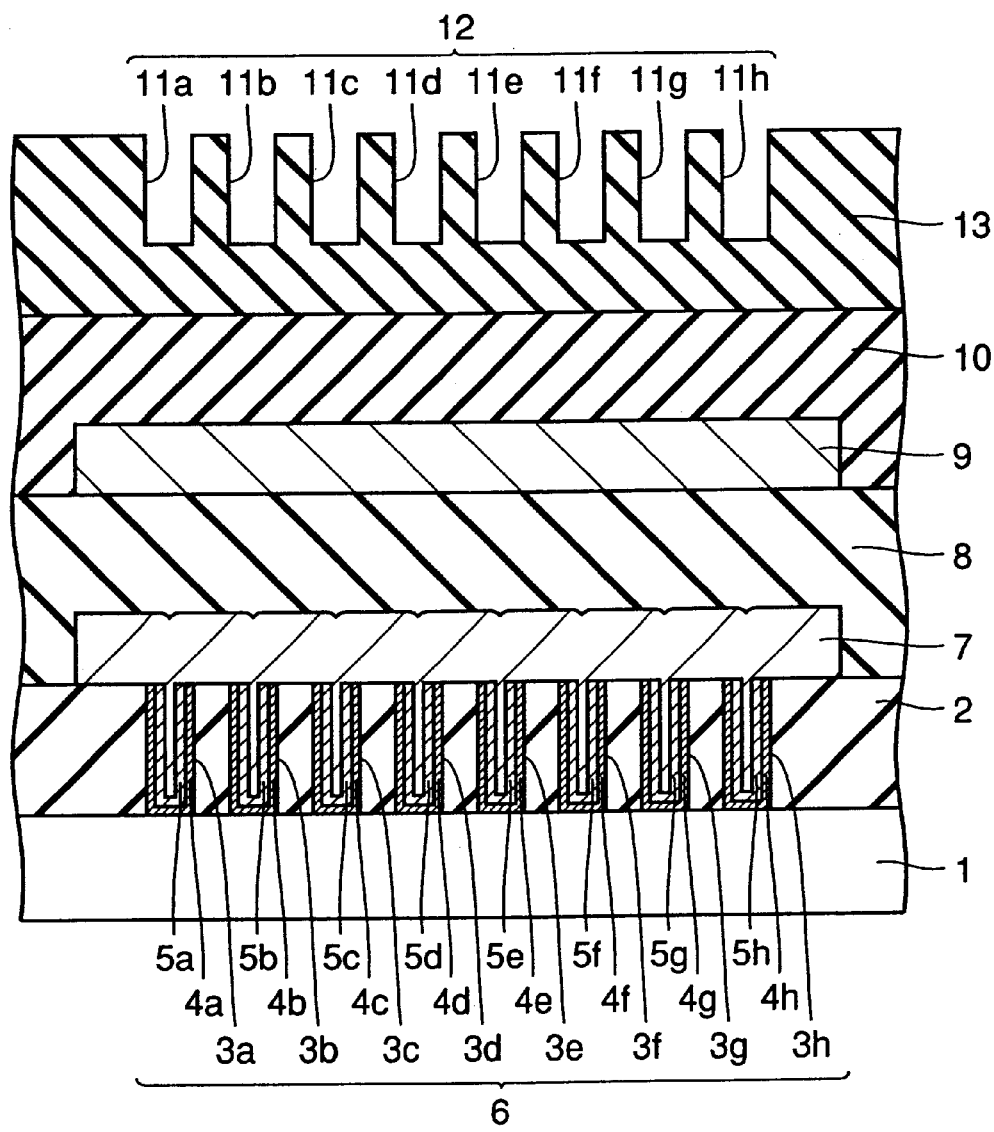
FIGS. 7 to 10 are schematic cross sectional views of semiconductor devices according to the second to fifth embodiments of the invention, respectively.

Referring to FIG. 7, a semiconductor device according to a second embodiment of the invention basically has the same structure as that of the semiconductor device according to the first embodiment shown in FIG. 1. However, in the semiconductor device shown in FIG. 7, a fourth interlayer insulating film 13 is formed on third interlayer insulating film 10, and an upper layer positional detection mark 12 is formed in fourth interlayer insulating film 13. At this time, no aluminum film is necessary in the region on the third interlayer insulating film 10 and on second aluminum film 9. Upper layer positional detection mark 12 may be used as a positional detection mark in the process of photolithography in forming interconnections of aluminum or the like on fourth interlayer insulating film 13.

Herein, in the semiconductor device shown in FIG. 7, the same effects as those obtained in the semiconductor device according to the first embodiment shown in FIG. 1 may be provided.

Note that the method of forming fourth interlayer insulating film 13 is basically the same as the method of forming third interlayer insulating film 10.

Third Embodiment

Figure 8:
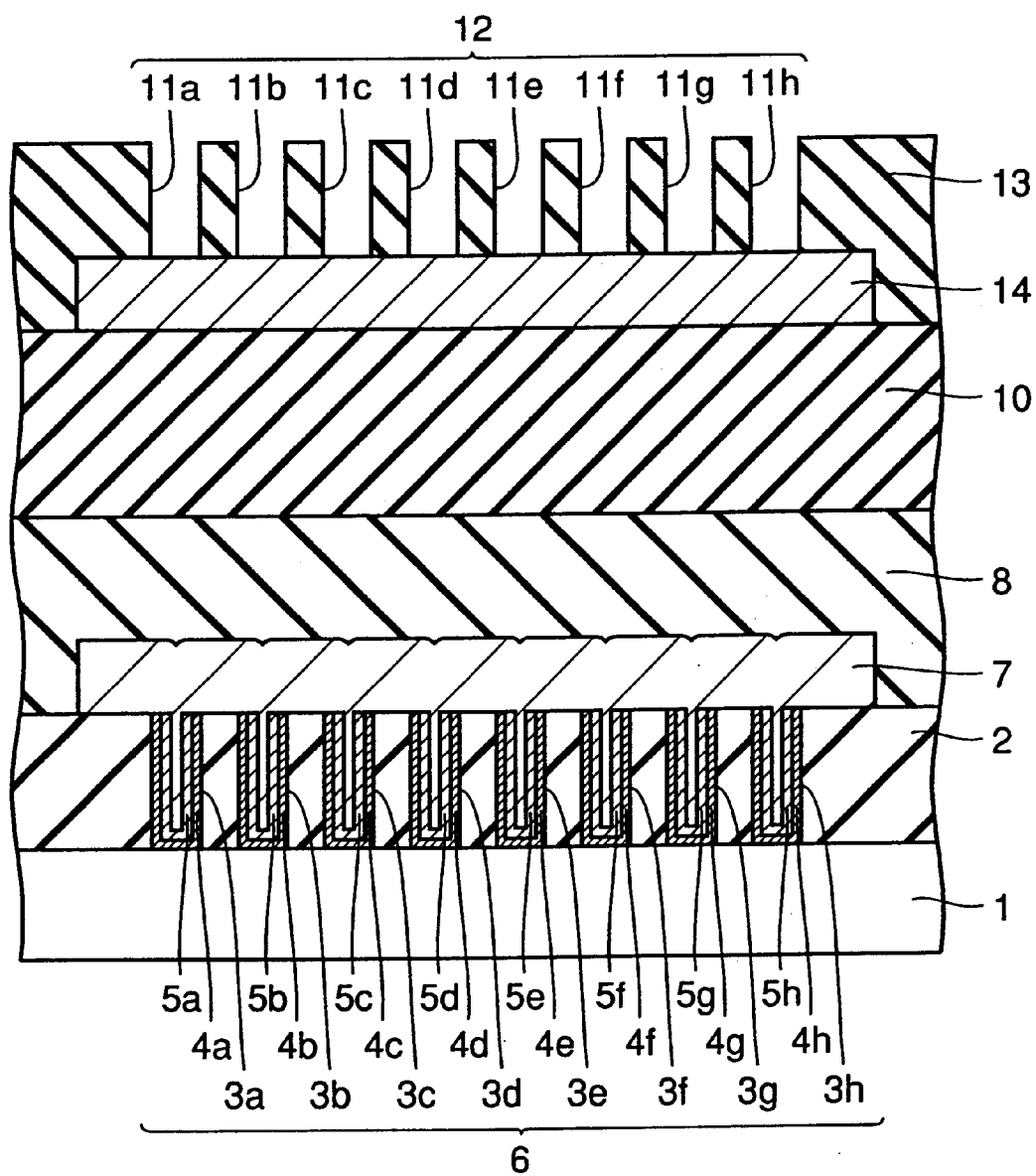

Referring to FIG. 8, a semiconductor device according to a third embodiment of the invention basically has the same structure as that of the semiconductor device according to the second embodiment shown in FIG. 7. Note however that in the semiconductor device shown in FIG. 8, a second aluminum film 14 is formed on third interlayer insulating film 10, not on the upper surface of second interlayer insulating film 8.

In the semiconductor device, the same effects as those in the semiconductor device according to the second embodiment shown in FIG. 7 may be obtained.

Fourth Embodiment

Figure 9:
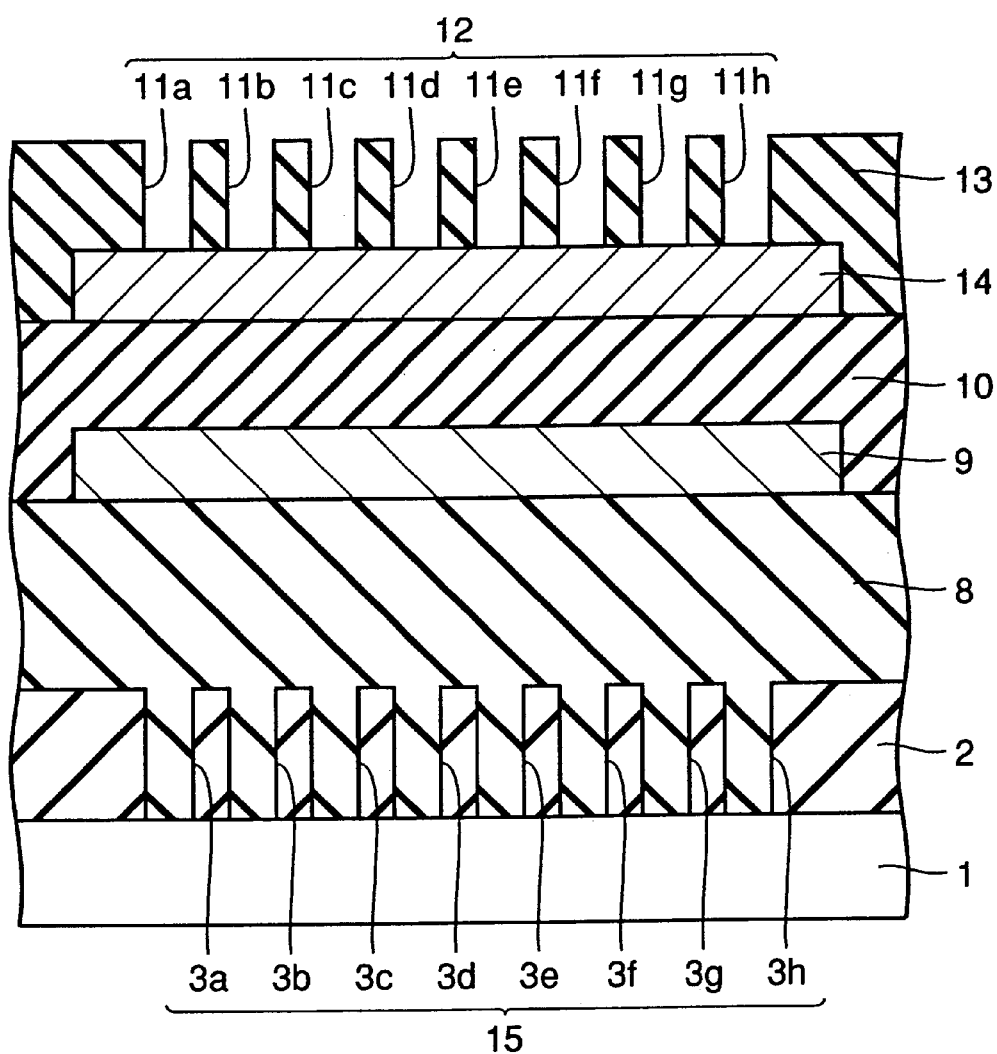

Referring to FIG. 9, a semiconductor device according to a fourth embodiment of the invention basically has the same structure as that of the semiconductor device according to the third embodiment shown in FIG. 8. However, in the semiconductor device shown in FIG. 9, no barrier metal layer and no tungsten film is formed in grooves 3a to 3h forming lower layer positional detection mark 15. An aluminum film is not formed in contact with the upper surface of first interlayer insulating film 2, while an aluminum film 9 is formed in the upper surface of second interlayer insulating film 8.

In the semiconductor device, the same effects as those in the semiconductor device according to the third embodiment shown in FIG. 8 may be obtained.

In addition, as shown in FIG. 9, if a positional detection mark 15 formed only of grooves 3a to 3h is employed for a lower layer positional detection mark in the semiconductor devices according to the first to third embodiments, the same effects may be obtained. In the semiconductor devices according to the first to fourth embodiments described above, lower layer positional detection marks 6 (FIGS. 1, 7 and 8) and 15 (FIG. 9) are both formed in first interlayer insulating film 2 on semiconductor substrate 1, but when these lower layer positional detection marks 6 and 15 are formed in second layer insulating film 8 or other interlayer insulating films formed at upper levels, the same effects as those obtained by the first to fourth embodiments may be provided by making structures on lower layer positional detection marks 6 and 15 the same as those by the first to fourth embodiments.

Fifth Embodiment

Figure 10:
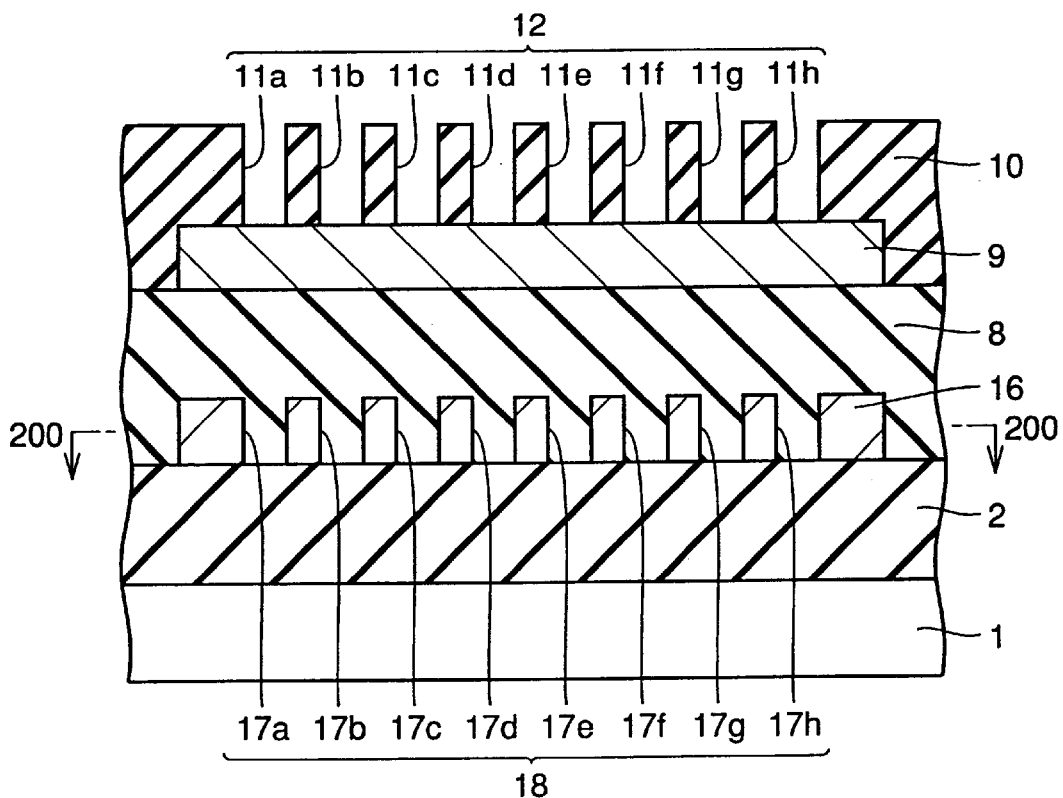

Referring to FIG. 10, a semiconductor device according to a fifth embodiment of the invention basically has the same structure as that of the semiconductor device according to the first embodiment shown in FIG. 1. However, in the semiconductor device shown in FIG. 10, a lower layer positional detection mark 18 is formed in an aluminum film 16 formed on first interlayer insulating film 2.

Figure 11:
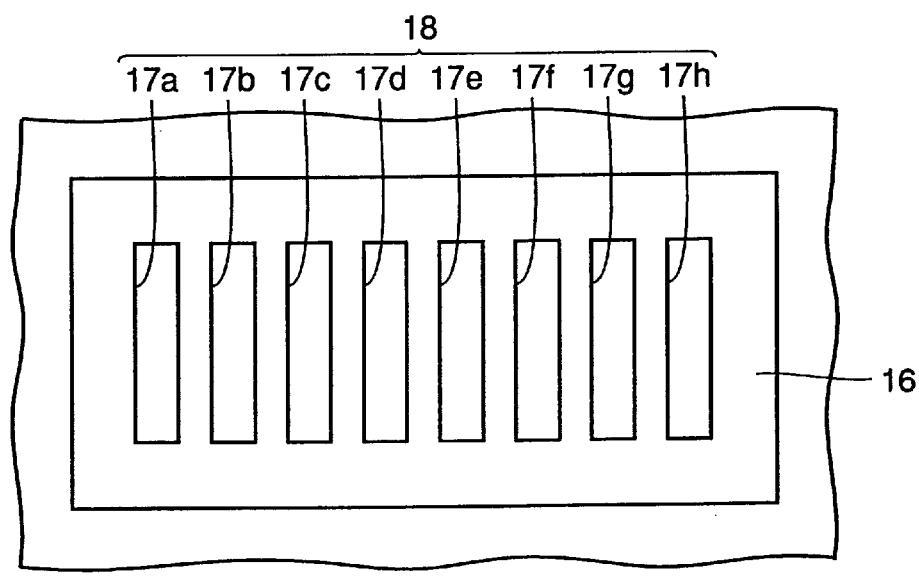
FIG. 11 is a schematic cross sectional view along line 200—200 in FIG. 10.

Herein, the cross sectional view of aluminum film 16 having lower layer positional detection mark 18 is given in FIG. 11. Referring to FIG. 11, lower layer positional detection mark 18 formed in aluminum film 16 is formed by grooves 17a to 17h, the cross sectional view of which is the same as that of grooves 3a to 3h forming lower layer positional detection mark 6 in the semiconductor device according to the first embodiment shown in FIG. 2.

In this case, the same effect as those obtained by the semiconductor device according to the first embodiment shown in FIG. 1 may be provided.

The step of forming aluminum film 16 is basically the same as the step of forming first and second aluminum films 7 and 9 shown in FIG. 1, and the step of forming lower layer positional detection mark 18 is the same as the step of forming grooves 3a to 3h forming lower layer positional detection mark 6 in the semiconductor device according to the first embodiment shown in FIG. 1.

Sixth Embodiment

Figure 12:
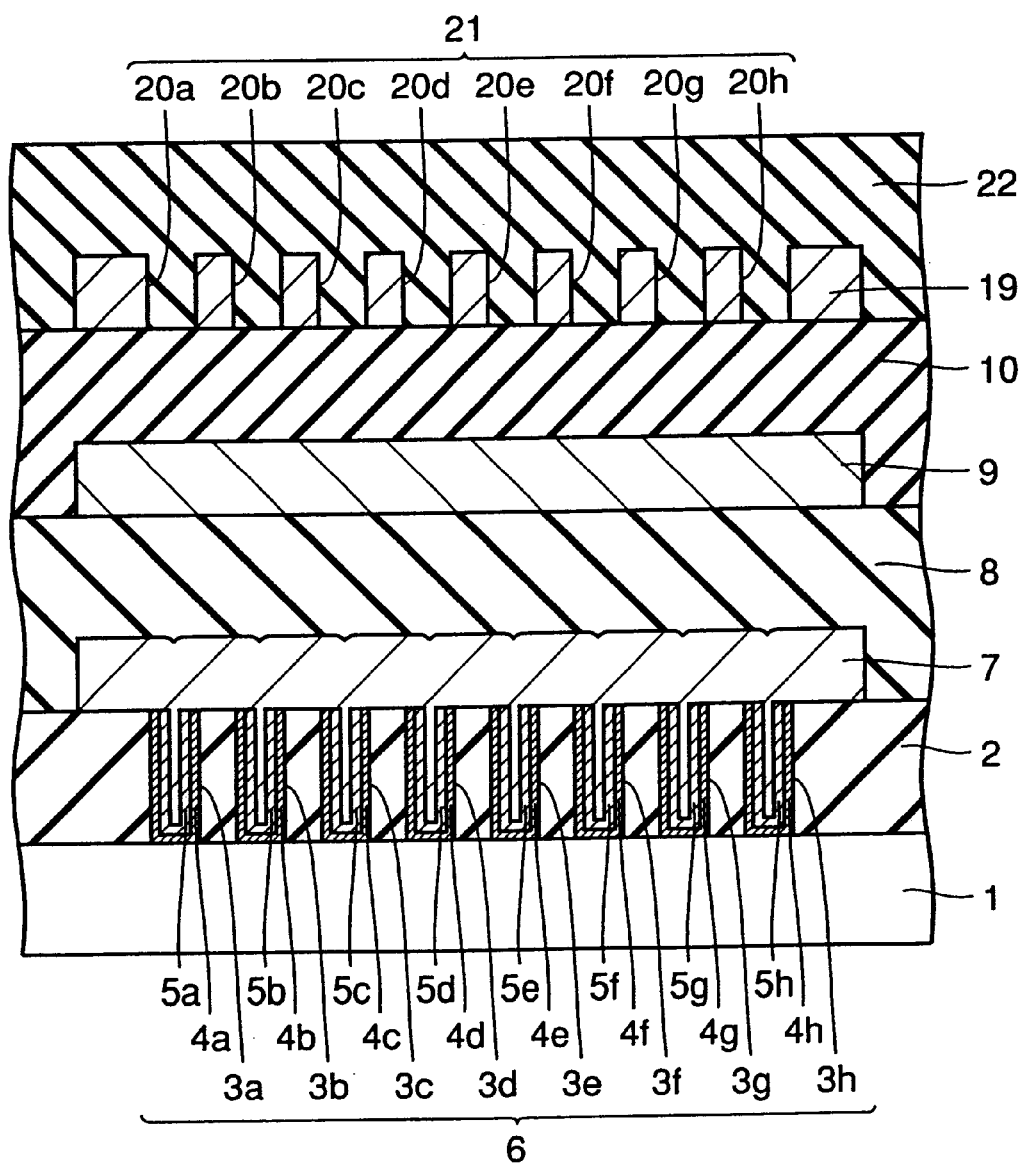
FIGS. 12 to 16 are schematic cross sectional views of semiconductor devices according to sixth to tenth embodiments of the invention, respectively.

Referring to FIG. 12, a semiconductor device according a sixth embodiment of the invention basically has the same structure as that of the semiconductor device according to the second embodiment shown in FIG. 7. However, in the semiconductor device shown in FIG. 12, an upper layer positional detection mark 21 is formed by grooves 20a to 20h formed in aluminum film 19. The cross sectional view of aluminum film 19 having upper layer positional detection mark 21 is the same as that of aluminum film 16 having lower layer positional detection mark 18 in the semiconductor device according to the fifth embodiment shown in FIG. 11. Aluminum film 19 having upper layer positional detection mark 21 is formed on third interlayer insulating film 10. A fourth interlayer insulating film 22 is formed on third interlayer insulating film 10 and aluminum film 19. Upper layer positional detection mark 21 may be used as an alignment mark in the process of photolithography for forming interconnections or the like on fourth interlayer insulating film 22.

In the semiconductor device, the same effects as those obtained in the semiconductor device according to the second embodiment shown in FIG. 7 may be provided.

The method of forming aluminum film 19 having upper positional detection mark 21 is basically the same as the step of forming aluminum film 16 in the semiconductor device according to the fifth embodiment shown in FIG. 11.

Seventh Embodiment

Figure 13:
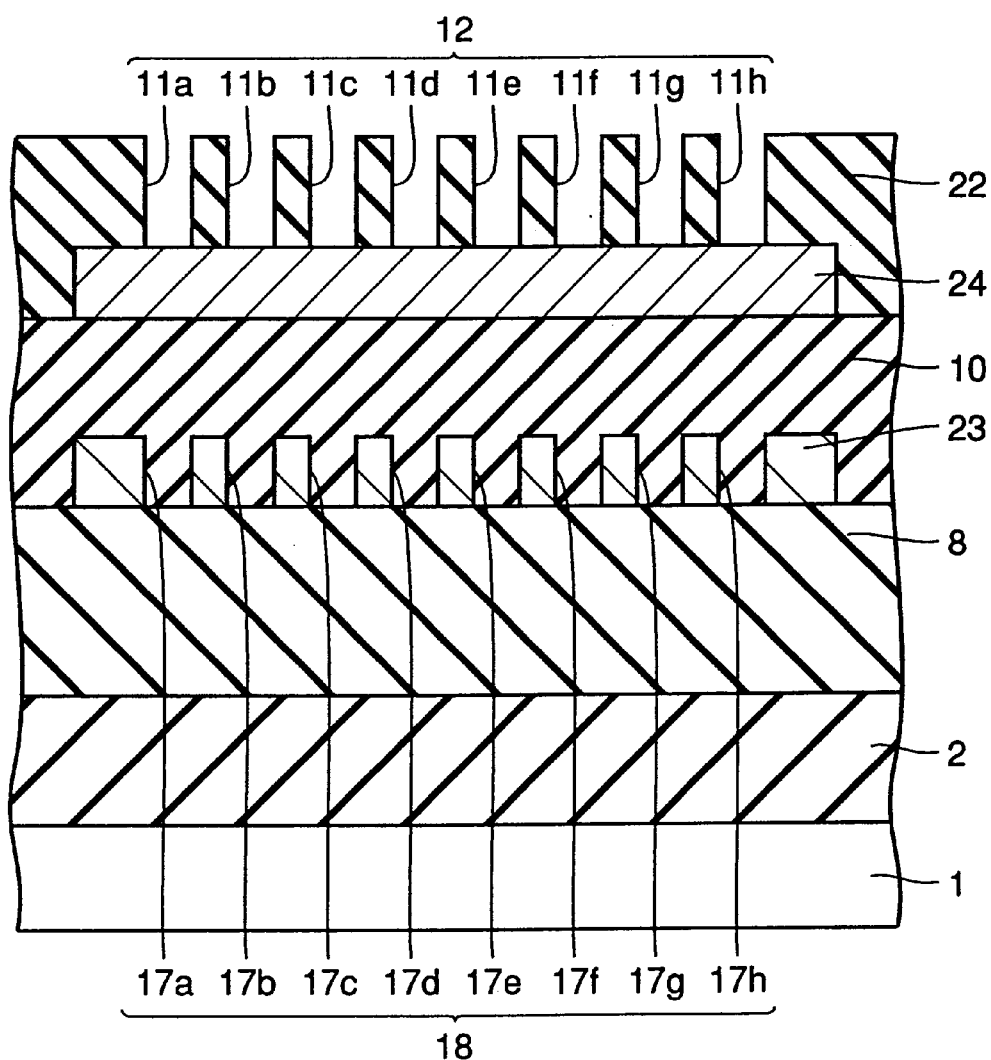

Referring to FIG. 13, a semiconductor device according to a seventh embodiment of the invention basically has the same structure as the semiconductor device according to the fifth embodiment shown in FIG. 10. However, in the semiconductor device shown in FIG. 13, an aluminum film 23 having lower layer positional detection mark 18 is formed on second interlayer insulating film 8. An aluminum film 24 serving as a shielding film is formed on third interlayer insulating film 10, and upper layer positional detection mark 12 is formed in fourth interlayer insulating film 22.

Thus, when lower layer positional detection mark 18 is formed in a layer in an upper level above second interlayer insulating film 8, at least one of third interlayer insulating film 10 having its upper surface planarized and aluminum film 24 serving as a shielding film is on positional detection mark 18, so that the same effects as those in the semiconductor device by the fifth embodiment may be obtained.

Note that in the semiconductor device shown in FIG. 13, although upper layer positional detection mark 12 is formed in fourth interlayer insulating film 22, the same effects may be obtained if upper layer positional detection mark 12 is formed in a fifth or sixth interlayer insulating film at an upper level above fourth interlayer insulating film 22.

Eighth Embodiment

Figure 14:
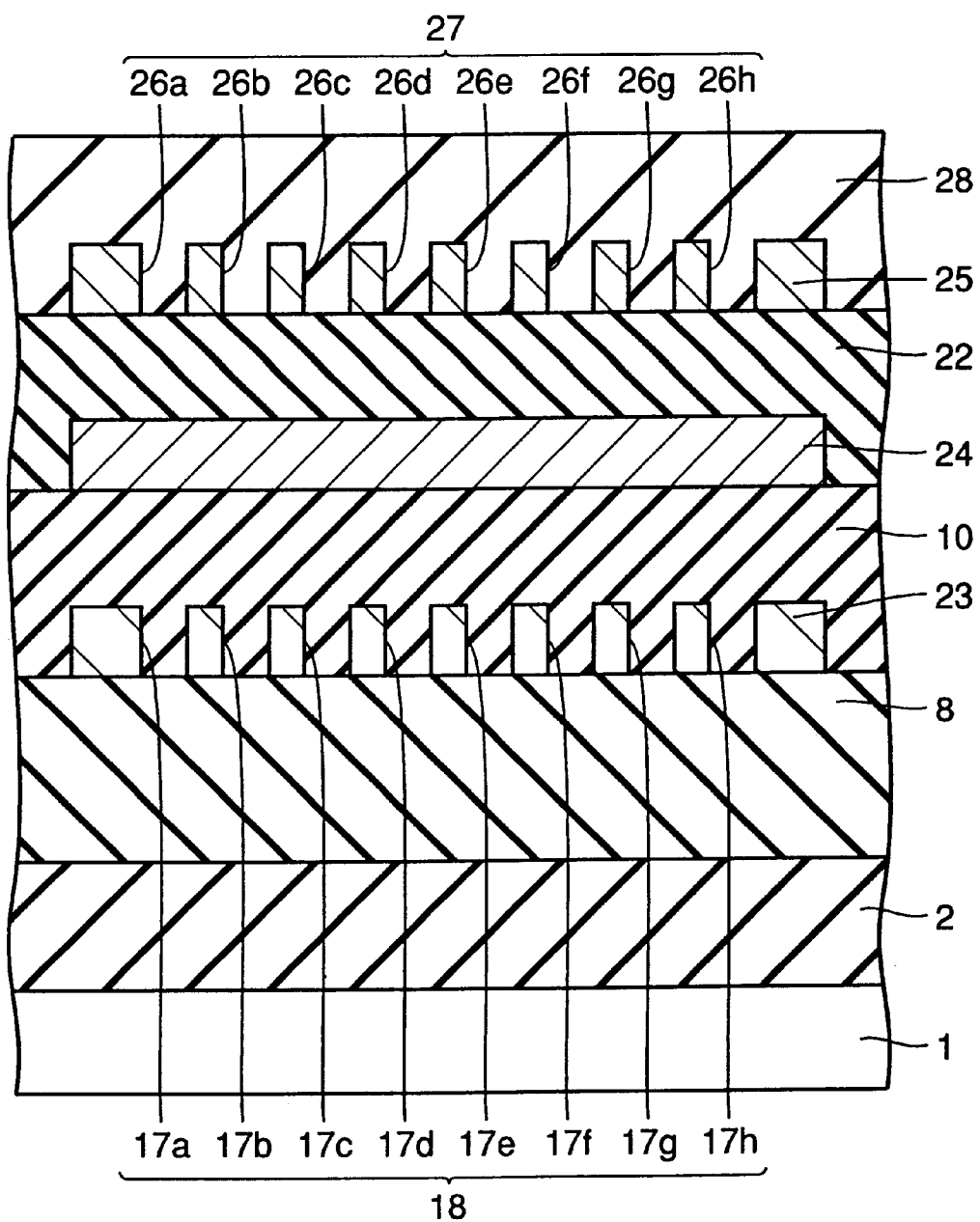

Referring to FIG. 14, a semiconductor device according to an eighth embodiment of the invention basically has the same structure as that of the semiconductor device according to the seventh embodiment shown in FIG. 13. However in the semiconductor device shown in FIG. 14, an upper layer positional detection mark 27 is formed in an aluminum film 25 formed on fourth interlayer insulating film 22. Herein, the cross sectional view of aluminum film 25 having upper layer positional detection mark 27 is the same as that of aluminum film 16 in the semiconductor device according to the fifth embodiment shown in FIG. 11. A fifth interlayer insulating film 28 is formed on fourth interlayer insulating film 22 and aluminum film 25.

In the semiconductor device shown in FIG. 14, the same effects as those obtained by the semiconductor device according to the seventh embodiment shown in FIG. 13 may be provided.

Ninth Embodiment

Figure 15:
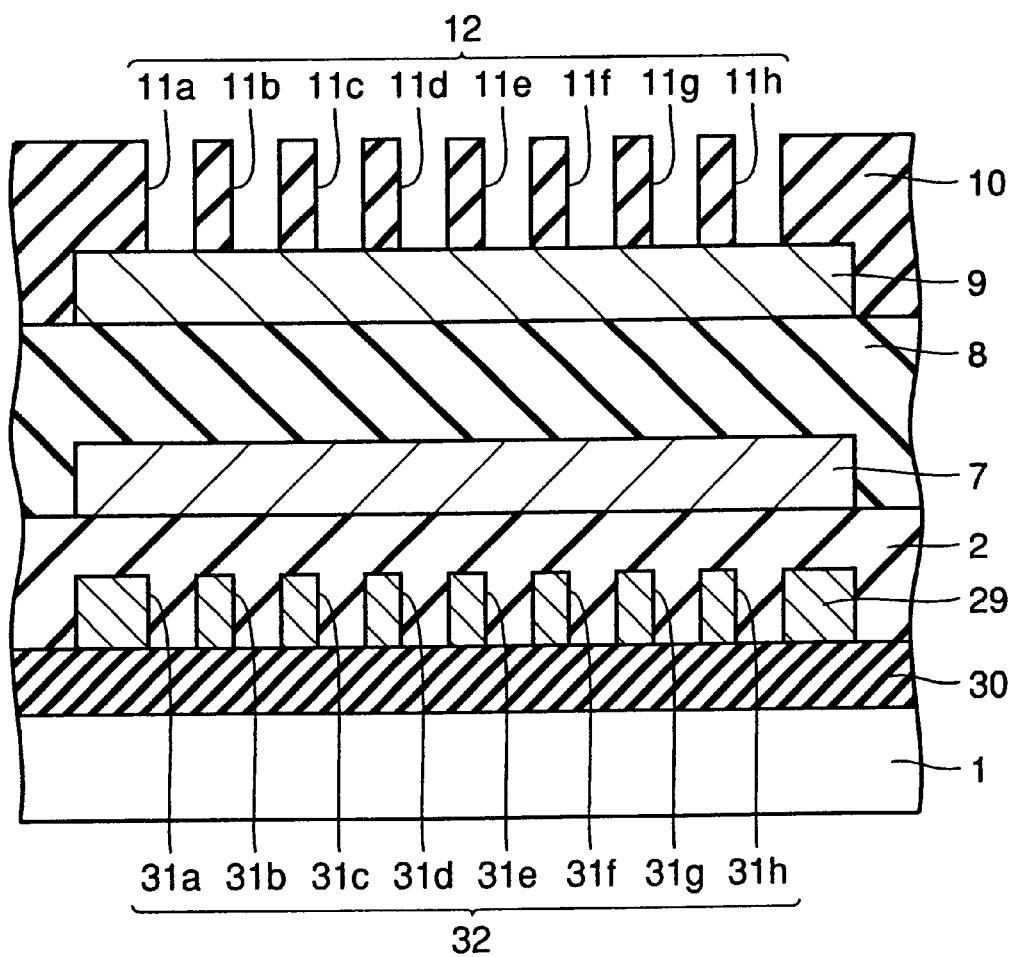

Referring to FIG. 15, a semiconductor device according to a ninth embodiment of the invention basically has the same structure as the semiconductor device according to the first embodiment shown in FIG. 1. However, in the semiconductor device shown in FIG. 15, a lower layer positional detection mark 32 is formed in a polysilicon film 29, a material forming a gate electrode of a field effect transistor formed on the main surface of semiconductor substrate 1. More specifically, grooves 31a to 31h are formed in polysilicon film 29, and grooves 31a to 32h form lower layer positional detection mark 32. The cross sectional view of polysilicon film 29 is the same as that of aluminum film 16 in the semiconductor device according to the fifth embodiment shown in FIG. 11. Polysilicon film 29 is formed on an isolation oxide film 30 formed on the main surface of semiconductor substrate 1.

In the semiconductor device shown in FIG. 15, the same effects as those obtained by the semiconductor device according to the first embodiment shown in FIG. 1 may be provided.

Note that at least one of aluminum films 7 and 9 shown in FIG. 15 needs only be formed, and the same effects may be provided if second interlayer insulating film 8 is not formed.

Tenth Embodiment

Figure 16:
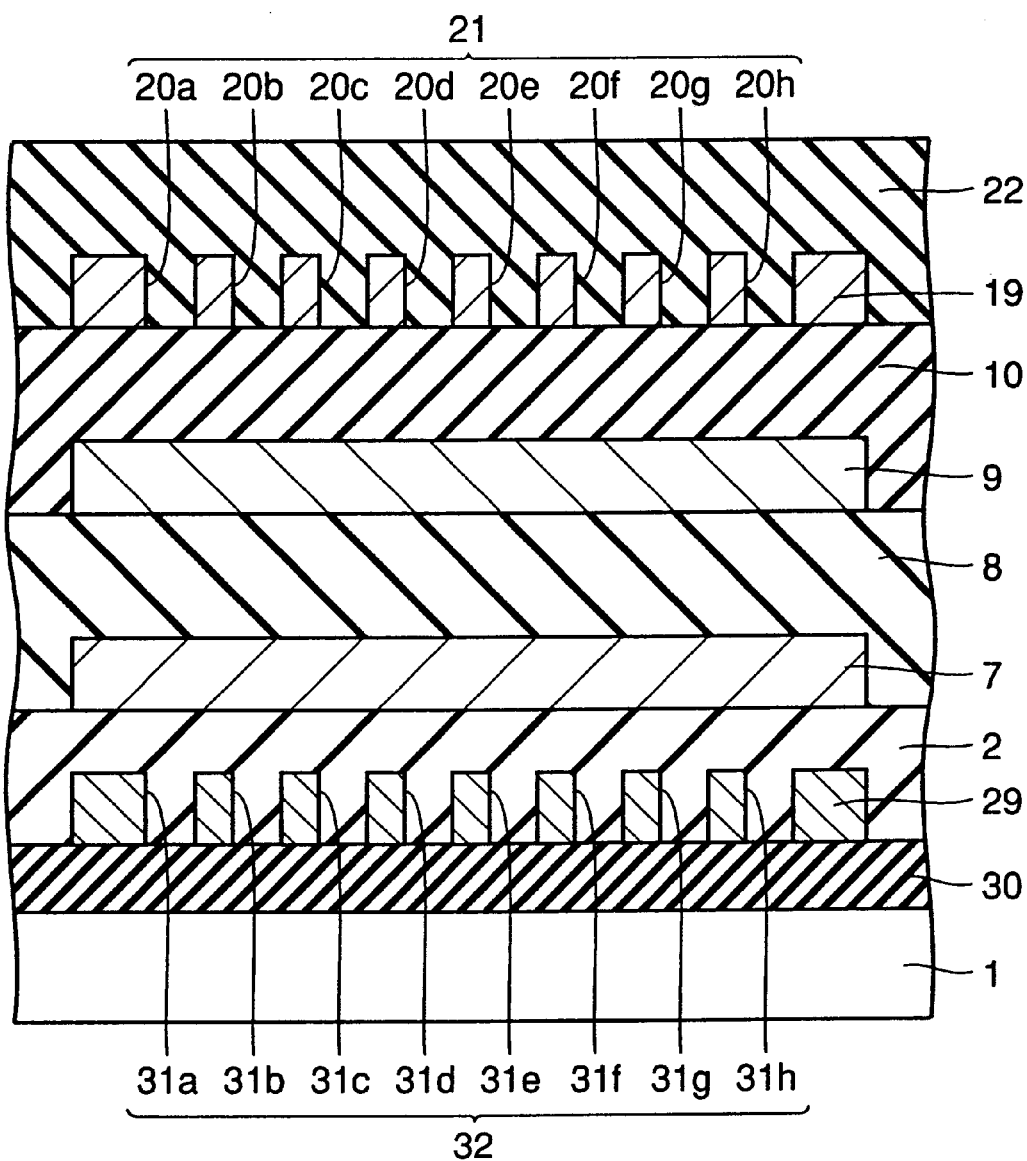

Referring to FIG. 16, a semiconductor device according to a tenth embodiment of the invention basically has the same structure as that of the semiconductor device according to the ninth embodiment shown in FIG. 15. However, in the semiconductor device shown in FIG. 16, an upper layer positional detection mark 21 is formed by grooves 20a to 20h formed in an aluminum film 19. Aluminum film 19 is formed on the upper surface of third interlayer insulating film 10. A fourth interlayer insulating film 22 is formed on third interlayer insulating film 10 and aluminum film 19.

In the semiconductor device shown in FIG. 16, the same effects as those obtained by the semiconductor device according to the ninth embodiment shown in FIG. 15 may be provided.

The first to tenth embodiments of the invention are applicable to positional detection marks having shapes or sizes different from those used in the first to tenth embodiments described above.

Embodiments 1 to 10 of the present invention can attain similar effects when implemented in sizes and shapes different from those illustrated.

Eleventh Embodiment

Figure 17:
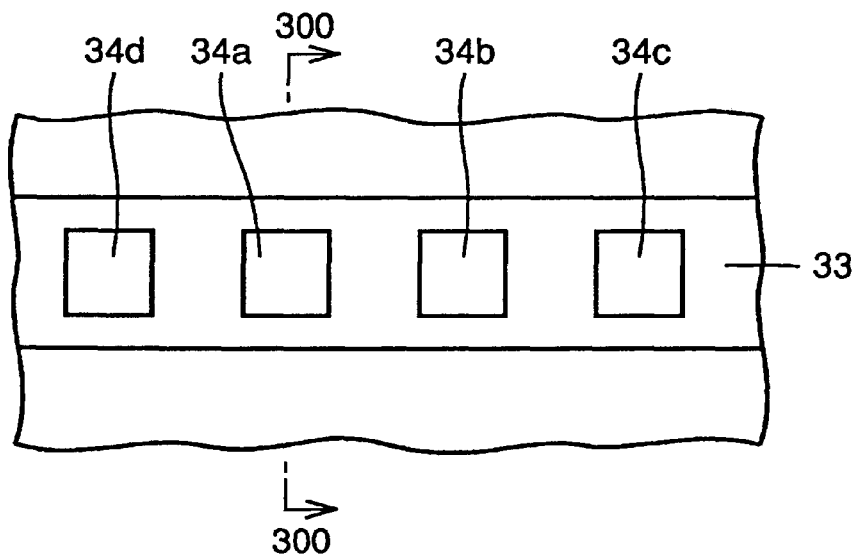
FIG. 17 is a schematic plan view showing a semiconductor device according to an eleventh embodiment of the invention.
Figure 18:
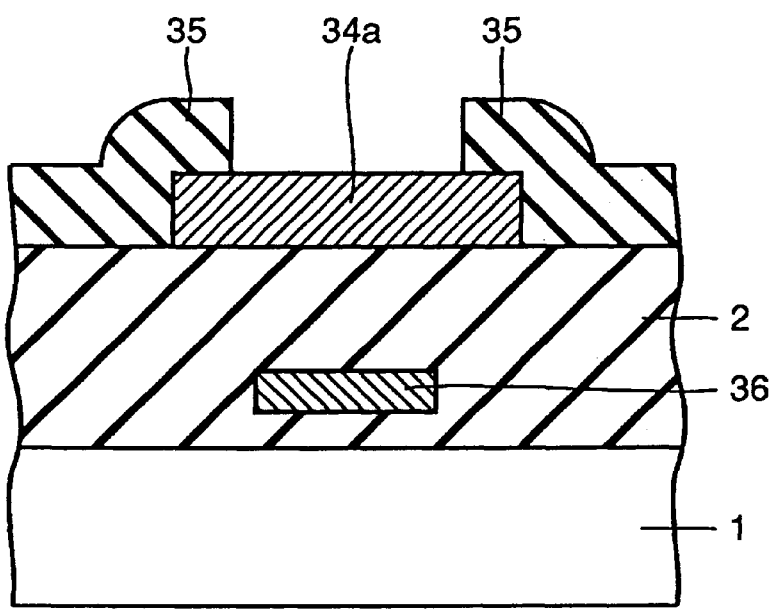
FIG. 18 is a schematic cross sectional view taken along line 300—300 in FIG. 17.

A semiconductor device according to an eleventh embodiment of the invention will be now described in conjunction with FIGS. 17 and 18.

Referring to FIGS. 17, the semiconductor includes a scribe line 33 and bonding pads 34a to 34d on scribe line 33 for connecting a bonding wire. Referring to FIG. 18, a glass coat 35 is formed to cover a part of bonding pad 34a. In a region positioned under bonding pad 34a, a group of quality testing elements (hereinafter referred to as TEG: Test Element Group) 36 is formed through interlayer insulating film 2. Thus, the TEG 36 is formed under bonding pad 34a through interlayer insulating film 2, in other words, the region positioned under bonding pad 34a which has not been effectively used may be utilized. As a result, the area occupied by bonding pad 34a and the TEG 3b may be reduced.

The two-dimensional shape of bonding pad 34a is a regular square of 90 μm×90 μm.

Twelfth Embodiment

Figure 19:
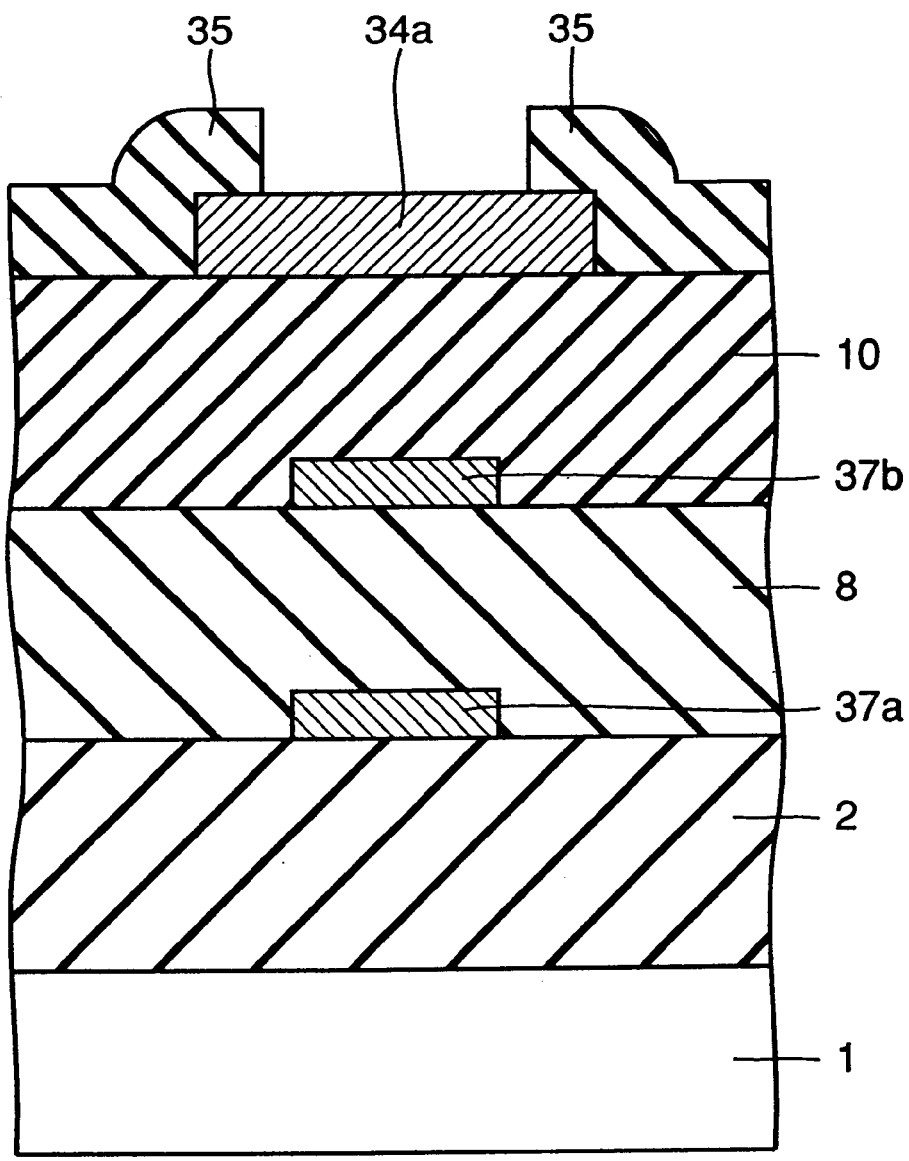
FIGS. 19 to 24 are schematic cross sectional views of semiconductor devices according to twelfth to sixteenth embodiments of the invention, respectively.

Referring to FIG. 19, a semiconductor device according to a twelfth embodiment of the invention basically has the same structure as that of the semiconductor device according to the eleventh embodiment shown in FIG. 18. In the semiconductor device shown in FIG. 19, in the region positioned under bonding pad 34a, TEGs 37a and 37b to check the conduction of interconnections are formed upon each other through interlayer insulating film 8. TEG 37a is used for checking the conduction of an interconnection formed on interlayer insulating film 2, while TEG 37b is used to check the conduction of an interconnection formed on interlayer insulating film 8.

Thus, in the semiconductor device shown in FIG. 19, the same effects as those obtained by the semiconductor device according to the eleventh embodiment shown in FIG. 18 may be provided. TEGs 37a and 37b are electrically insulated from each other by interlayer insulating film 8, and therefore will not adversely affect each other in respective checking of the conduction of interconnections. Therefore, placing TEGs 37a and 37b in a layered manner reduces the area occupied by these elements as compared to the conventional cases.

Thirteenth Embodiment

Figure 20:
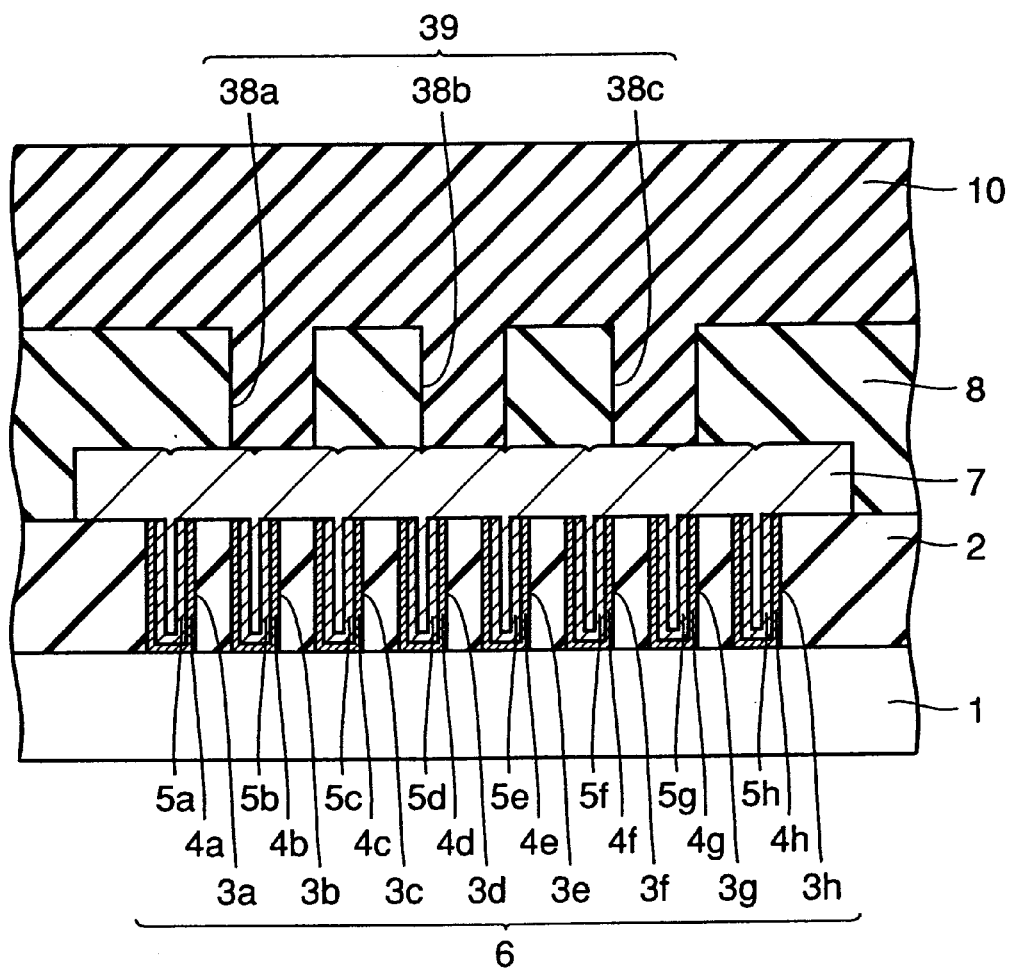

Referring to FIG. 20, a semiconductor device according to a thirteenth embodiment of the invention includes a lower layer positional detection mark 6, an aluminum film 7, and a dummy pattern 39, i.e., a dummy layer. Lower layer positional detection mark 6 and aluminum film 7 have the same structures as those of lower layer positional detection mark 6 and aluminum film 7 in the semiconductor device according to the first embodiment shown in FIG. 1. A second interlayer insulating film 8 is formed on a first interlayer insulating film 2 and aluminum film 7. Grooves 38a to 38c are provided in the region of second interlayer insulating film 8 positioned on aluminum film 7. Dummy pattern 39 is formed to change the ratio of the area of an opening in the semiconductor wafer surface for the purpose of adjusting the polishing rate in CMP or the etching rate in anisotropic etching. A third interlayer insulating film 10 is formed on second interlayer insulating film 8.

Herein, lower layer positional detection mark 6 may be formed by grooves in an aluminum film as is the case with lower layer positional detection mark 18 in the semiconductor device according to the fifth embodiment shown in FIG. 10.

Thus, by placing positional detection mark 6 and dummy pattern 39 in a layered manner, dummy pattern 39 may be formed using only the region having positional detection mark 6, and therefore the ratio of the area occupied by positional detection mark 6 and dummy pattern 39 in the semiconductor wafer may be reduced.

Note that in the semiconductor device shown in FIG. 20, although dummy pattern 39 is formed in the region positioned on lower layer positional detection mark 6, dummy pattern 39 may be formed on a TEG. In such a case the same effects may be obtained. Also in this case, positional detection mark 6 formed in the lower layer and the TEG may be either electrically insulated or not insulated from dummy pattern 39 formed in the upper layer.

Figure 27:
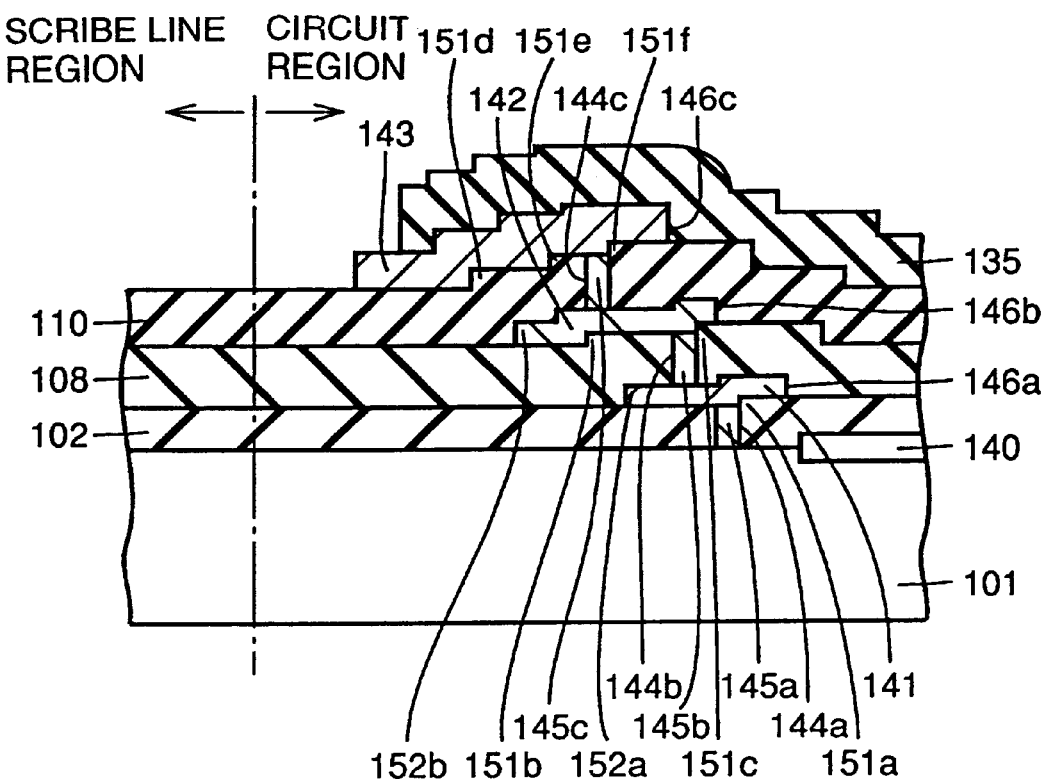
FIG. 27 is a schematic cross sectional view of another conventional semiconductor device.

Herein, in the above described embodiments, the reduction in the area occupied by positional detection marks or TEGs by forming these marks or elements in a layered manner, while in view of reducing the occupied area, the same disadvantage is present in a layered interconnection structure in a circuit region adjacent to the scribe line region of the semiconductor device as shown in FIG. 27.

Referring to FIG. 27, a conventional semiconductor device includes first to third aluminum interconnections 141, 142 and 143. In the circuit region, a circuit region structure 140 such as a field effect transistor is formed on the main surface of semiconductor substrate 101. A first interlayer insulating film 102 is formed on semiconductor substrate 101 and circuit region structure 140. At this time, the presence of circuit region structure 140 on semiconductor substrate 101 causes a stepped portion 151a to form on the upper surface of first interlayer insulating film 102.

Subsequently, in a prescribed region of first interlayer insulating film 102, a contact hole 144a is formed. A conductor film 145a is formed in contact hole 144a, and first aluminum interconnection 141 is formed on conductor film 145a. At this time, at the stepped portion 151a of first interlayer insulating film 102, aluminum interconnection 141 is formed to extend along stepped portion 151a, in order to prevent first aluminum interconnection 141 from coming off from the surface of first interlayer insulating film 102.

Then, a second interlayer insulating film 108 is formed on first interlayer insulating film 102 and first aluminum interconnection 141. At this time, an end portion 152a of first aluminum interconnection 141 and the stepped portion 151a of first interlayer insulating film 102 cause stepped portions 151b and 151c to form on the upper surface of second interlayer insulating film 108. A contact hole 144b is formed in the region of second interlayer insulating film 108 positioned on first aluminum interconnection 141. A conductor film 145b is formed in contact hole 144b, and second aluminum interconnection 142 is formed on conductor film 145b. At this time, aluminum interconnection 142 is formed along stepped portions 151b and 151c in order to prevent second aluminum interconnection 142 from coming off from the surface of second interlayer insulating film 108 at these stepped portions 151b and 151c.

Subsequently, a third interlayer insulating film 110 is formed on second interlayer insulating film 108 and second aluminum interconnection 142. At this time, an end portion 152b of second aluminum interconnection 142 and stepped portions 151b and 151c at the upper surface of second interlayer insulating film 108 cause stepped portions 151d to 151f to form at the upper surface of third interlayer insulating film 110. Third aluminum interconnection 143 is formed along stepped portions 151d to 151f in order to prevent the aluminum interconnection from coming off from the surface of third interlayer insulating film 110 at these stepped portions 151d to 151f. Third aluminum interconnection 143 is formed on conductor film 145c formed in contact hole 144c, and is electrically connected with second aluminum interconnection 142. A glass coat 135 is formed on third interlayer insulating film 110 and third aluminum interconnection 143.

Thus, in the conventional semiconductor device, as a larger number of interlayer insulating films are placed upon each other, the number and size of steps formed on the surface of the upper layer interlayer insulating films increase because of steps formed at the upper surface of the lower layer interlayer insulating films and end portions of aluminum interconnections. Therefore, aluminum interconnections 141 to 143 are partially shifted two-dimensionally, in order to prevent these aluminum interconnections 141 to 143 from coming off from the upper surface of the interlayer insulating films 102, 108 and 110 at stepped portions 151a to 151f. Therefore, the positions of the side surfaces 146a to 146c of first to third aluminum interconnections 141 to 143 are not aligned in the vertical direction, and an area larger than the case of simply placing first to third aluminum interconnections 141 to 143 upon each other is occupied. Hence, if the area occupied by such a layered interconnection structure in the vicinity of the scribe line region can be reduced, the surface of semiconductor substrate 101 can be more effectively utilized, which results in a smaller occupied area per semiconductor device. Thus, a larger number of semiconductor devices may be obtained from a single semiconductor wafer.

Figure 21:
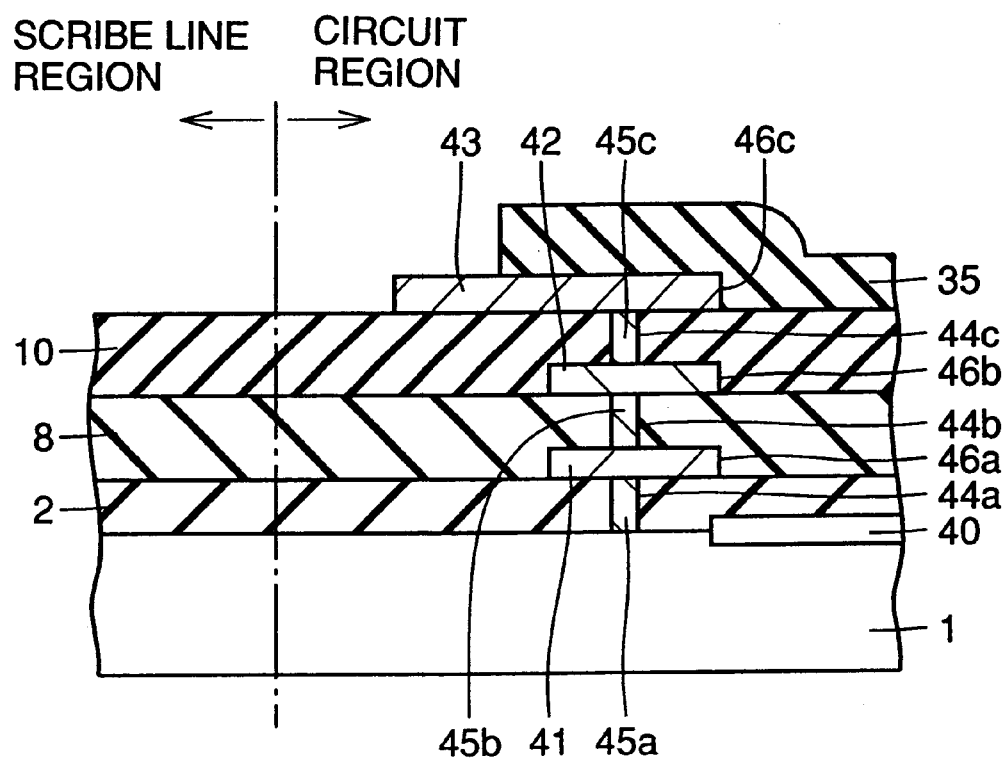

As a result, in the semiconductor device according to the thirteenth embodiment shown in FIG. 20, the layered interconnection structure in the vicinity of the scribe line may have a structure as shown in FIG. 21. Referring to FIG. 21, such a semiconductor device will be now described.

Referring to FIG. 21, the semiconductor device basically has the same structure as that of the conventional layered interconnection structure shown in FIG. 27, but first to third interlayer insulating films 2, 8, and 10 have their upper surfaces planarized by means of CMP or the like. As a result, steps resulting from structures positioned under the upper surfaces of first to third interlayer insulating films 2, 8 and 10 are not present unlike the conventional case, and side surfaces 46a to 46c of first to third aluminum interconnections 41 to 43 may be positioned in substantially two-dimensionally overlapping regions. As a result, the area occupied by these first to third aluminum interconnections 41 to 43 may be smaller than the case of positioning these aluminum interconnections two-dimensionally shifted from each other as practiced in the conventional case.

As can be seen, the semiconductor device shown in FIG. 21 has basically the same structure as the semiconductor device shown in FIG. 27. More specifically, element 40 in FIG. 21 represents the circuit region structure (corresponding to circuit region structure 140 of FIG. 27), elements 44a to 44c represent the contact holes (corresponding to contact holes 144a to 144c of FIG. 27), and elements 45a to 45c represent conductor films (corresponding to conductor films 145a to 145c of FIG. 27), respectively. Referring to FIG. 21, a third aluminum interconnection 43 is connected to the second aluminum interconnection 42 through the conductor film 45c formed in the contact hole 44c. The second aluminum interconnection 42 is connected to the first aluminum interconnection through the conductor film 45b formed in the contact hole 44b. The first aluminum interconnection 41 is connected to a conductive region (not shown) in the main surface of the semiconductor substrate through the conductor film 45a formed in the contact hole 44a.

Fourteenth Embodiment

Figure 22:
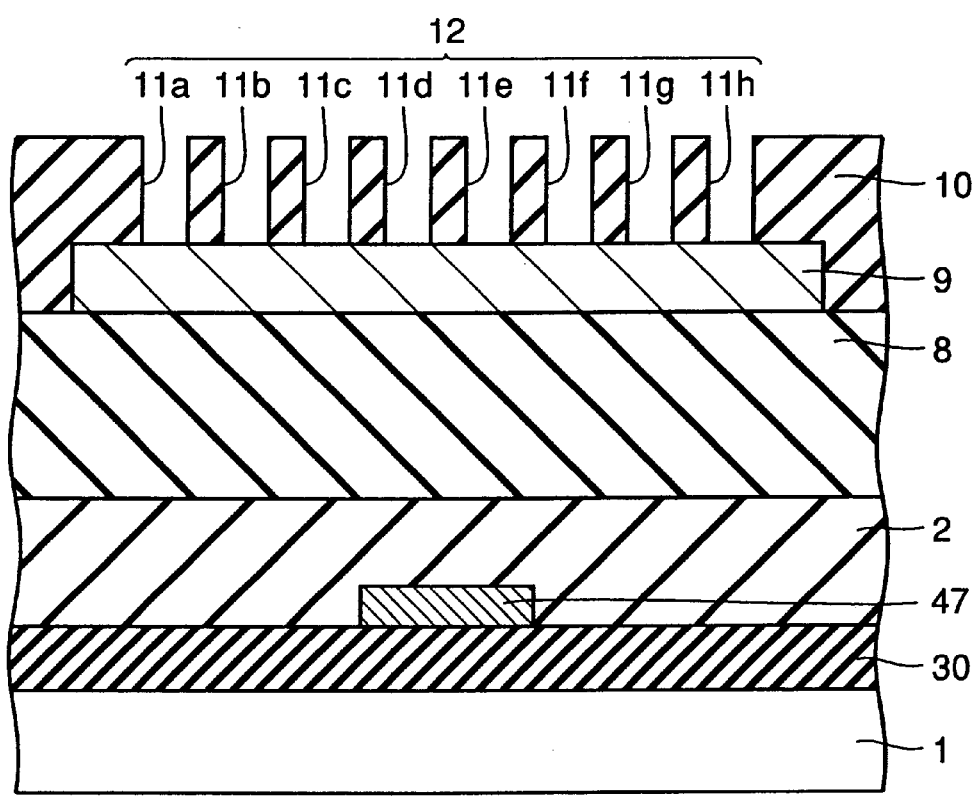

Referring to FIG. 22, a semiconductor device according to a fourteenth embodiment of the invention basically has the same structure as that of the semiconductor device according to the ninth embodiment shown in FIG. 15. However, in the semiconductor device shown in FIG. 22, an aluminum film is not formed to be in contact with the upper surface of first interlayer insulating film 2, and a TEG 47, not the lower layer positional detection mark, is formed on isolation oxide film 30 on the main surface of semiconductor substrate 1. Aluminum film 9 is formed to cover a region larger than the region in which upper layer positional detection mark 12 is formed.

Therefore, the position of upper layer positional detection mark 12 is not erroneously detected because of the presence of TEG 47, and positional detection mark 12 and TEG 47 may be formed upon each other in a layered manner, so that the same effects as those obtained by the semiconductor device according to the first embodiment shown in FIG. 1 may be provided.

Fifteenth Embodiment

Figure 23:
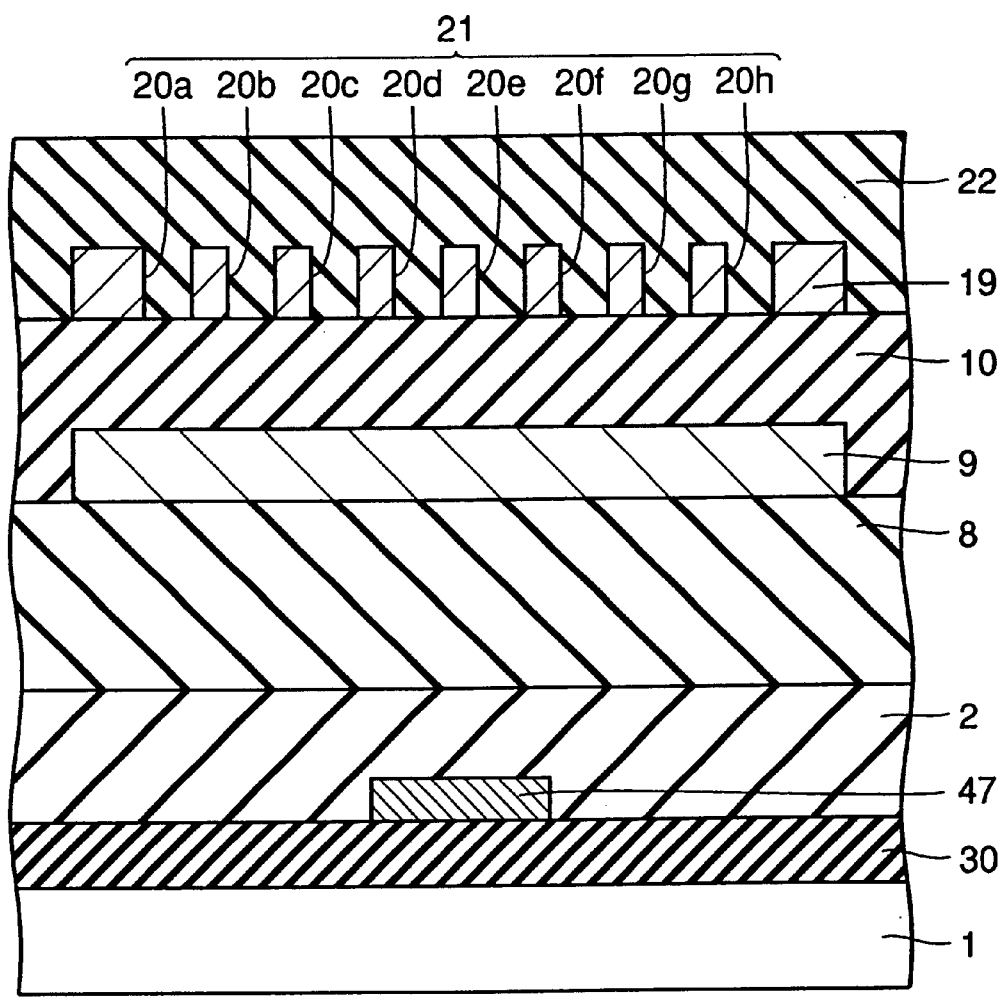

Referring to FIG. 23, a semiconductor device according to a fifteenth embodiment of the invention basically has the same structure as the semiconductor device according to the fourteenth embodiment shown in FIG. 22. However, in the semiconductor device shown in FIG. 23, an aluminum film 19 is formed on third interlayer insulating film 10, and an upper layer positional detection mark 21 formed by grooves 20a to 20h is formed in aluminum film 19. A fourth interlayer insulating film 22 is formed on third interlayer insulating film 10 and aluminum film 19.

As a result, in the semiconductor device shown in FIG. 23, TEG 47 and upper layer positional detection mark 21 may be formed in a layered manner through aluminum film 9 serving as a shielding film, and therefore the same effects as those obtained by the semiconductor device according to the first embodiment shown in FIG. 1 may be provided.

Sixteenth Embodiment

Figure 24:
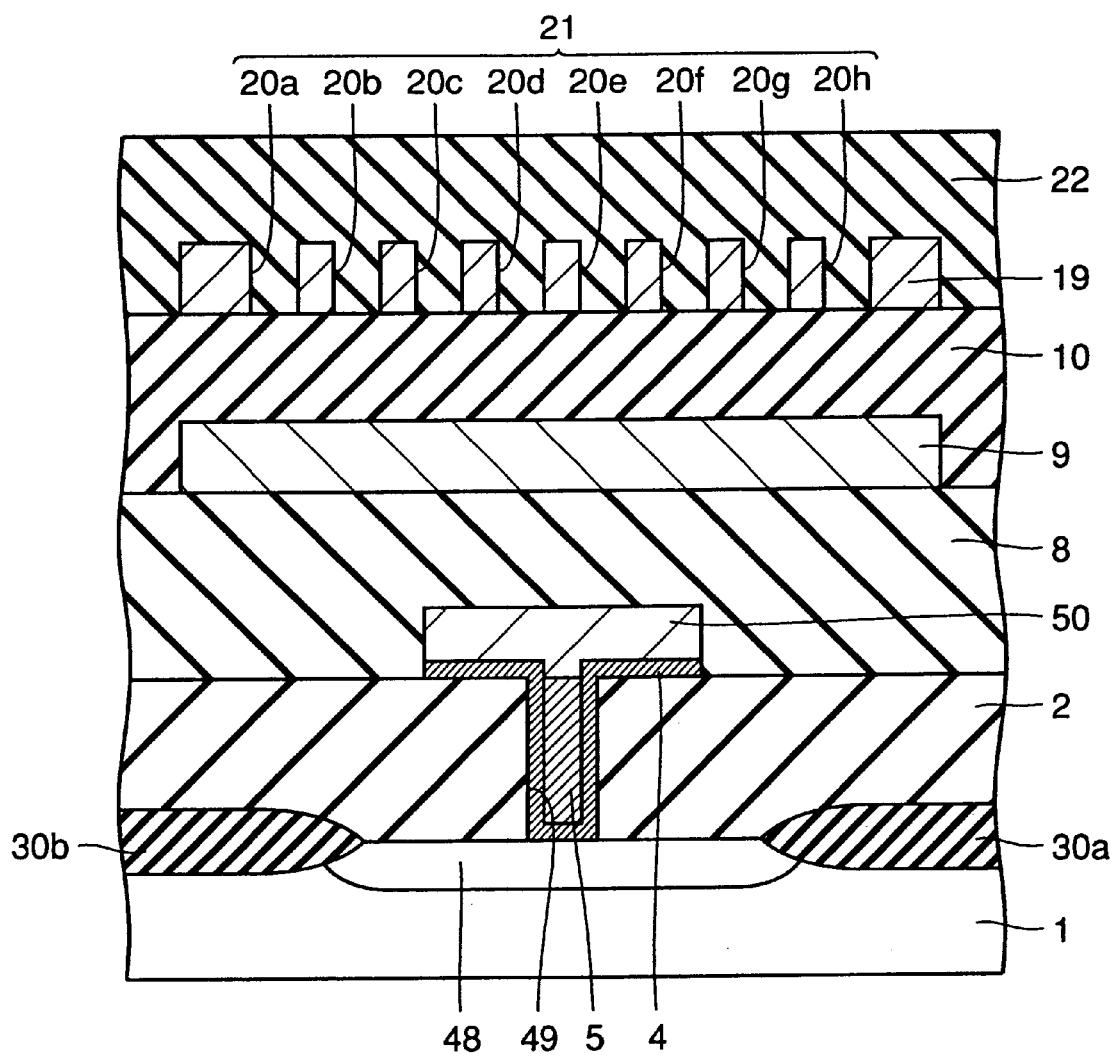
Figure 25:
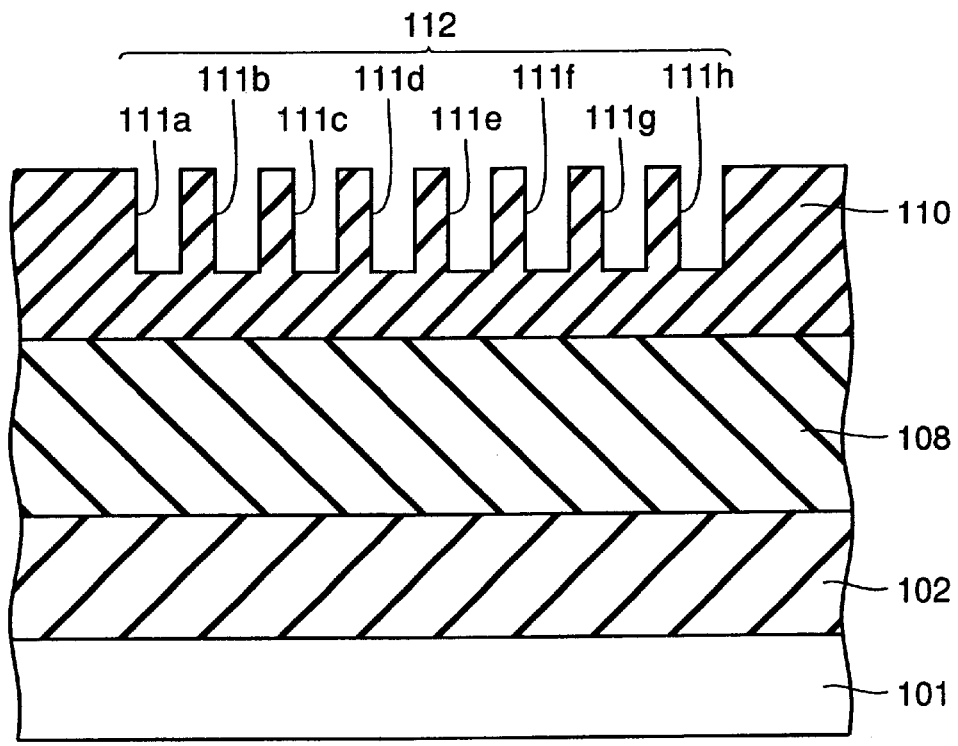
FIG. 25 is a schematic cross sectional view of a conventional semiconductor device.
Figure 26:
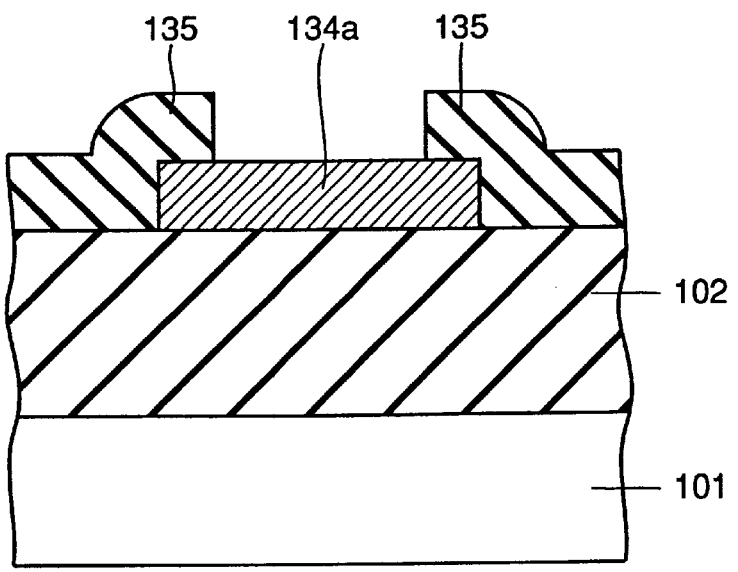
FIG. 26 is a schematic cross sectional view of another conventional semiconductor device.

Referring to FIG. 24, a semiconductor device according to a sixteenth embodiment of the invention basically has the same structure as that of the semiconductor device according to the fifteenth embodiment shown in FIG. 23. However, in the semiconductor device shown in FIG. 24, isolation oxide films 30a and 30b are formed on the main surface of semiconductor substrate 1, and a conductive region 48 is formed on the main surface of semiconductor substrate 1 surrounded by isolation oxide films 30a and 30b. In the region of first interlayer insulating film 2 positioned on conductive region 48, a contact hole 49 is formed. A barrier metal layer 4 is formed on first interlayer insulating film 2 and in contact hole 49. A tungsten film 5 is formed on barrier metal layer 4 in contact hole 49. An interconnection 50 of aluminum is formed on barrier metal layer 4 and tungsten film 5.

Also in the semiconductor device shown in FIG. 24, by the presence of aluminum film 9 serving as a shielding film, light used for detecting positional detection mark 21 will not reach interconnection 50 or the like in the lower layers. As a result, while preventing erroneous detection of positional detection mark 21 in the upper layer, positional detection mark 21 and interconnection 50 in the lower layer may be formed in a layered manner. As a result, the area positioned under upper layer positional detection mark 21 which has not been conventionally effectively utilized may be used effectively, so that the same effects as those obtained by the semiconductor device according to the first embodiment shown in FIG. 1 may be provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device, comprising the steps of:

forming a lower layer including at least one selected from the group consisting of a positional detection mark, a quality testing element, and a circuit element;

forming a shielding film for shielding an energy beam used for detecting a positional detection mark on said lower layer; and forming an upper layer including a positional detection mark on said shielding film, wherein said shielding film extends outside the outermost circumference of at least one of said positional detection mark on said shielding film and said at least one selected from the group consisting of a positional detection mark, a quality testing element, and a circuit element; and said shielding film has a flat upper surface enabling said positional detection mark on said shielding film to be formed independently of a structure of said lower layer.

2. The method as recited in claim 1, further comprising the steps of:

forming an interlayer insulating film between said lower layer and said shielding film; and planarizing an upper surface of said interlayer insulating film.

* * * * *